US009543912B2

(12) United States Patent
Lee

(10) Patent No.: US 9,543,912 B2
(45) Date of Patent: Jan. 10, 2017

(54) BUFFER CIRCUIT HAVING AN ENHANCED SLEW-RATE AND SOURCE DRIVING CIRCUIT INCLUDING THE SAME

(71) Applicant: SAMSUNG ELECTRONICS CO., LTD, Suwon-si, Gyeonggi-do (KR)

(72) Inventor: Sung-Ho Lee, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 120 days.

(21) Appl. No.: 14/286,131

(22) Filed: May 23, 2014

(65) Prior Publication Data
US 2015/0084694 A1    Mar. 26, 2015

(30) Foreign Application Priority Data

Sep. 23, 2013 (KR) .................. 10-2013-0112790

(51) Int. Cl.
*H03F 3/45* (2006.01)
*H03F 1/48* (2006.01)
*H03F 3/30* (2006.01)

(52) U.S. Cl.
CPC .......... *H03F 3/45071* (2013.01); *H03F 1/483* (2013.01); *H03F 3/301* (2013.01); *H03F 3/45179* (2013.01); *H03F 2200/36* (2013.01); *H03F 2203/45248* (2013.01)

(58) Field of Classification Search
CPC ....................................................... H03F 3/303
USPC ................. 330/253, 255, 257, 258
See application file for complete search history.

(56) References Cited

U.S. PATENT DOCUMENTS

| | | | |
|---|---|---|---|
| 6,771,126 B2 | 8/2004 | Blankenship et al. | |
| 7,391,264 B2 | 6/2008 | Watanabe | |
| 7,576,610 B2 | 8/2009 | Dalena | |
| 7,863,982 B2 | 1/2011 | Chen et al. | |
| 7,884,671 B2 | 2/2011 | Chung | |
| 2007/0176913 A1* | 8/2007 | Satou | G09G 3/3688 345/204 |
| 2011/0298777 A1* | 12/2011 | Tsuchi | G09G 3/3275 345/211 |

* cited by examiner

*Primary Examiner* — Khanh V Nguyen
*Assistant Examiner* — Khiem Nguyen
(74) *Attorney, Agent, or Firm* — F. Chau & Associates, LLC

(57) ABSTRACT

A buffer circuit is provided. The buffer circuit includes an operational amplifier and a slew-rate compensating circuit. The operational amplifier amplifies an input voltage signal and generates an output voltage signal. The slew-rate compensating circuit generates a compensation current based on a voltage difference between the input voltage signal and the output voltage signal, and provides the compensation current to a load stage of the operational amplifier.

9 Claims, 22 Drawing Sheets

US 9,543,912 B2

BUFFER CIRCUIT HAVING AN ENHANCED SLEW-RATE AND SOURCE DRIVING CIRCUIT INCLUDING THE SAME

CROSS-REFERENCE TO RELATED PATENT APPLICATION

This application claims priority under 35 U.S.C. §119 to Korean Patent Application No. 10-2013-0112790 filed on Sep. 23, 2013 in the Korean intellectual Property Office, the disclosure of which is incorporated by reference herein in its entirety.

TECHNICAL FIELD

The present inventive concept relates to a display device, and more particularly, to a buffer circuit having an enhanced slew-rate and a source driving circuit including the same.

DISCUSSION OF THE RELATED ART

Since a liquid crystal display (LCD) device is thinner and lighter than a cathode ray tube and its quality has been gradually improved, the LCD device has been widely used as an information processing apparatus.

A display device such as an LCD device may include a source driving circuit for driving a display panel. The source driving circuit may include an output buffer circuit that outputs data.

SUMMARY

According to an exemplary embodiment of the present inventive concept, a buffer circuit is provided. The buffer circuit includes an operational amplifier and a slew-rate compensating circuit. The operational amplifier is configured to amplify an input voltage signal and to generate an output voltage signal. The slew-rate compensating circuit is configured to generate a compensation current based on a voltage difference between the input voltage signal and the output voltage signal, and to provide the compensation current to a load stage of the operational amplifier.

In an exemplary embodiment of the present inventive concept, the slew-rate compensating circuit may provide the compensation current to the load stage when the voltage difference is greater than a predetermined voltage.

In an exemplary embodiment of the present inventive concept, the slew-rate compensating circuit may provide the compensation current to one end of an output capacitor in the load stage when the voltage difference is greater than a predetermined voltage.

In an exemplary embodiment of the present inventive concept, the predetermined voltage may correspond to a threshold voltage of a particular metal-oxide-semiconductor (MOS) transistor the slew-rate compensating circuit.

In an exemplary embodiment of the present inventive concept, the slew-rate compensating circuit may be configured to generate a push compensation current that flows into the operational amplifier and a pull compensation current that flows out of the operational amplifier.

In an exemplary embodiment of the present inventive concept, the slew-rate compensating circuit may include a comparator, a pull compensation current generator, and a push compensation current generator. The comparator may be configured to compare the input voltage signal with the output voltage signal and to generate a first current corresponding to the voltage difference. The pull compensation current generator may be configured to perform a current-mirror operation on the first current and to generate the pull compensation current. The push compensation current generator may be configured to perform the current-mirror operation on the first current and to generate the push compensation current.

In an exemplary embodiment of the present inventive concept, the comparator may include an NMOS transistor and a PMOS transistor. The NMOS transistor may have a gate to which the input voltage signal is applied, a source to which the output voltage signal is applied, and a drain connected to a first node. The PMOS transistor may have a gate to which the input voltage signal is applied, a source to which the output voltage signal is applied, and a drain connected to a second node.

In an exemplary embodiment of the present inventive concept, the NMOS transistor may be turned on and the PMOS transistor may be turned off, and the pull compensation current generator may be activated, and the slew-rate compensating circuit may provide the pull compensation current to the load stage when the input voltage signal is greater than the output voltage signal by a threshold voltage in the NMOS transistor.

In an exemplary embodiment of the present inventive concept, the PMOS transistor may be turned on and the NMOS transistor may be turned off, and the push compensation current generator may be activated, and the slew-rate compensating circuit may provide the push compensation current to the load stage when the output voltage signal is greater than the input voltage signal by a threshold voltage in the PMOS transistor.

In an exemplary embodiment of the present inventive concept, a body of the NMOS transistor may be electrically connected to a source of the NMOS transistor, and a body of the PMOS transistor may be electrically connected to a source of the PMOS transistor.

In an exemplary embodiment of the present inventive concept, the pull compensation current generator may include a first current source, a first PMOS transistor, a second PMOS transistor, a third PMOS transistor, a fourth PMOS transistor, a first NMOS transistor, and a second NMOS transistor. The first current source may be configured to generate a first supply current whose magnitude is adjusted in response to a first control signal. The first PMOS transistor may have a source connected to a supply voltage, and a drain and a gate commonly connected to the first current source. The second PMOS transistor may have a source connected to the supply voltage, and a gate connected to the gate of the first PMOS transistor. The third PMOS transistor may have a source connected to a drain of the second PMOS transistor, and a drain and a gate commonly connected to the first node. The fourth PMOS transistor may have a source connected to the supply voltage, and a gate connected to the gate of the third PMOS transistor. The first NMOS transistor may have a drain and a gate commonly connected to a drain of the fourth PMOS transistor, and a source connected to a ground. The second NMOS transistor may have a gate connected to the gate of the first NMOS transistor, a source connected to the ground, and a drain from which the pull compensation current is output.

In an exemplary embodiment of the present inventive concept, the push compensation current generator may include a second current source, a first NMOS transistor, a second NMOS transistor, a third NMOS transistor, a fourth NMOS transistor, a first PMOS transistor, and a second PMOS transistor. The second current source may be configured to generate a second supply current whose magnitude is adjusted in response to a second control signal. The first NMOS transistor may have a source connected to a ground, and a drain and a gate commonly connected to the second current source. The second NMOS transistor may have a source connected to the ground, and a gate connected to the gate of the first NMOS transistor. The third NMOS transistor may have a source connected to a drain of the second NMOS transistor, and a drain and a gate commonly connected to the second node. The fourth NMOS transistor may have a source connected to the ground, and a gate connected to the gate of the third NMOS transistor. The first PMOS transistor may have a drain and a gate commonly connected to a drain of the fourth NMOS transistor, and a source connected to a supply voltage. The second PMOS transistor may have a gate connected to the gate of the first PMOS transistor, a source connected to the supply voltage, and a drain from which the push compensation current is output.

In an exemplary embodiment of the present inventive concept, the pull compensation current generator may include a first PMOS transistor, a second PMOS transistor, a third PMOS transistor, a first NMOS transistor, and a second NMOS transistor. The first PMOS transistor may have a source connected to a supply voltage, and a gate connected to an output terminal of a first current mirror circuit included in the load stage of the operational amplifier. The second PMOS transistor may have a source connected to a drain of the first PMOS transistor, a drain and a gate commonly connected to the first node. The third PMOS transistor may have a source connected to the supply voltage, and a gate connected to a gate of the second PMOS transistor. The first NMOS transistor may have a drain and a gate commonly connected to a drain of the third PMOS transistor, and a source connected to a ground. The second NMOS transistor may have a gate connected to the gate of the first NMOS transistor, a source connected to the ground, and a drain from which the pull compensation current is output.

In an exemplary embodiment of the present inventive concept, the push compensation current generator may include a first NMOS transistor, a second NMOS transistor, a third NMOS transistor, a first PMOS transistor, and a second PMOS transistor. The first NMOS transistor may have a source connected to a ground, and a gate connected to an output terminal of a second current mirror circuit included in the load stage of the operational amplifier. The second NMOS transistor may have a source connected to a drain of the first NMOS transistor, and a drain and a gate commonly connected to the second node. The third NMOS transistor may have a source connected to the ground, and a gate connected to the gate of the second NMOS transistor. The first PMOS transistor may have a drain and a gate commonly connected to a drain of the third NMOS transistor, and a source connected to a supply voltage. The second PMOS transistor may have a gate connected to the gate of the first PMOS transistor, a source connected to the supply voltage, and a drain from which the push compensation current is output.

In an exemplary embodiment of the present inventive concept, the operational amplifier may include an input stage, the load stage, and an output stage. The input stage may be configured to receive the input voltage signal and the output voltage signal, and to determine the voltage difference between the input voltage signal and the output voltage signal. The load stage may be configured to perform a slew-rate compensating operation using the pull compensation current and the push compensation current, to generate load currents corresponding to the voltage difference, and to provide the load currents to the input stage. The output stage may be connected to the load stage, and may be configured to generate the output voltage signal.

In an exemplary embodiment of the present inventive concept, the input stage may include a first input stage and a second input stage. The first input stage may include PMOS transistors, and may be configured to receive a pulling load current from the load stage. The second input stage may include NMOS transistors, and may be configured to receive a pushing load current from the load stage.

In an exemplary embodiment of the present inventive concept, the operational amplifier may further include a plurality of transmission gates through which the input stage receives the input voltage signal and the output voltage signal. Each of the transmission gates may be controlled to be turned on or off based on a chopping signal.

In an exemplary embodiment of the present inventive concept, the pulling load current may flow from the first input stage to the load stage, and the pushing load current may flow from the load stage to the second input stage.

In an exemplary embodiment of the present inventive concept, the operational amplifier may further include a first bias circuit and a second bias circuit. The first bias circuit may be configured to provide a first bias current to the first input stage. The second bias circuit may be configured to provide a second bias current to the second input stage.

In an exemplary embodiment of the present inventive concept, the load stage may include a first current mirror circuit, a second current mirror circuit, a first connecting circuit, a second connecting circuit, a first capacitor, and a second capacitor. The first current mirror circuit may be electrically connected to the second input stage, and may be configured to provide a third current to the load stage. The second current mirror circuit may be electrically connected to the first input stage, and may be configured to provide a fourth current to the load stage. The first connecting circuit may be configured to electrically connect a first output terminal of the first current mirror circuit and a first output terminal of the second current mirror circuit. The second connecting circuit may be configured to electrically connect a second output terminal of the first current mirror circuit and a second output terminal of the second current mirror circuit. The first capacitor may be connected between the first output terminal of the first current mirror circuit and an output terminal of the output stage. The second capacitor may be connected between the first output terminal of the second current mirror circuit and the output terminal of the output stage.

In an exemplary embodiment of the present inventive concept, the push compensation current may be provided to the first output terminal of the first current mirror circuit, and the pull compensation current may be provided to the first output terminal of the second current mirror circuit.

According to an exemplary embodiment of the present inventive concept, a source driving circuit of a display device is provided. The source driving circuit includes a shift register, a data latch circuit, a digital-to-analog converting circuit, and a buffer circuit. The shift register is configured to generate a pulse signal based on a clock signal and an input/output control signals. The data latch circuit is configured to latch data according to a shift order of the shift register and to output the data as digital input signals in response to a load signal. The digital-to-analog converting circuit is configured to generate input voltage signals corresponding to the digital input signals using a gray voltage. The buffer circuit includes an operational amplifier and a slew-rate compensating circuit. The operational amplifier is configured to amplify an input voltage signal and to generate an output voltage signal. The slew-rate compensating circuit is configured to generate a compensation current based on a voltage difference between the input voltage signal and the output voltage signal, and to provide the compensation current to a load stage of the operational amplifier.

According to an exemplary embodiment of the present inventive concept, a method of controlling a buffer circuit is provided. The method include generating a slew-rate compensation current based on a voltage difference between an input voltage signal and an output voltage signal, providing the slew-rate compensation current to a load stage of an operational amplifier in the buffer circuit, and buffering the input voltage signal to generate the output voltage signal based on the slew-rate compensation current.

In an exemplary embodiment of the present inventive concept, the slew-rate compensation current may be provided when the voltage difference is greater than a predetermined voltage.

In an exemplary embodiment of the present inventive concept, the determined voltage corresponds to a threshold voltage of a MOS transistor in the buffer circuit.

In an exemplary embodiment of the present inventive concept, the generating of the slew-rate compensation current may include comparing a magnitude of the input voltage signal and a magnitude of the output voltage signal, generating a first current based on the comparison result, generating a pull compensation current based on the first current, and generating a push compensation current based on the first current.

According to an exemplary embodiment of the present inventive concept, an operational amplifier is provided. The operational amplifier includes an input stage, a load stage, and an output stage. The input stage is configured to receive an input voltage signal and an output voltage signal, and to determine a voltage difference between the input voltage signal and the output voltage signal. The load stage is configured to perform a slew-rate compensating operation, to generate load corresponding to the voltage difference, and to provide the load currents to the input stage. The output stage is connected to the load stage, and is configured to generate the output voltage signal.

In an exemplary embodiment of the present inventive concept, the input stage may include a first input stage. The first input stage may include PMOS transistors, and may be configured to receive a pulling load current from the load stage.

In an exemplary embodiment of the present inventive concept, the input stage may further include a second input stage. The second input stage may include NMOS transistors, and may be configured to receive a pushing load current from the load stage.

According to an exemplary embodiment of the present inventive concept, a slew-rate compensating circuit included in a buffer circuit is provided. The circuit includes a pull compensation current generator and a push compensation current generator. The pull compensation current generator is configured to generate a pull compensation current when an input voltage signal of the buffer circuit is greater than an output voltage signal of the buffer circuit by a predetermined voltage. The push compensation current generator is configured to generate a push compensation current when the output voltage signal is greater than the input voltage signal by the predetermined voltage.

BRIEF DESCRIPTION OF THE DRAWINGS

The foregoing and other features of the present inventive concept will become more apparent by describing in detail with reference to the accompanying drawings wherein.

DETAILED DESCRIPTION OF THE EMBODIMENTS

Figure 1:
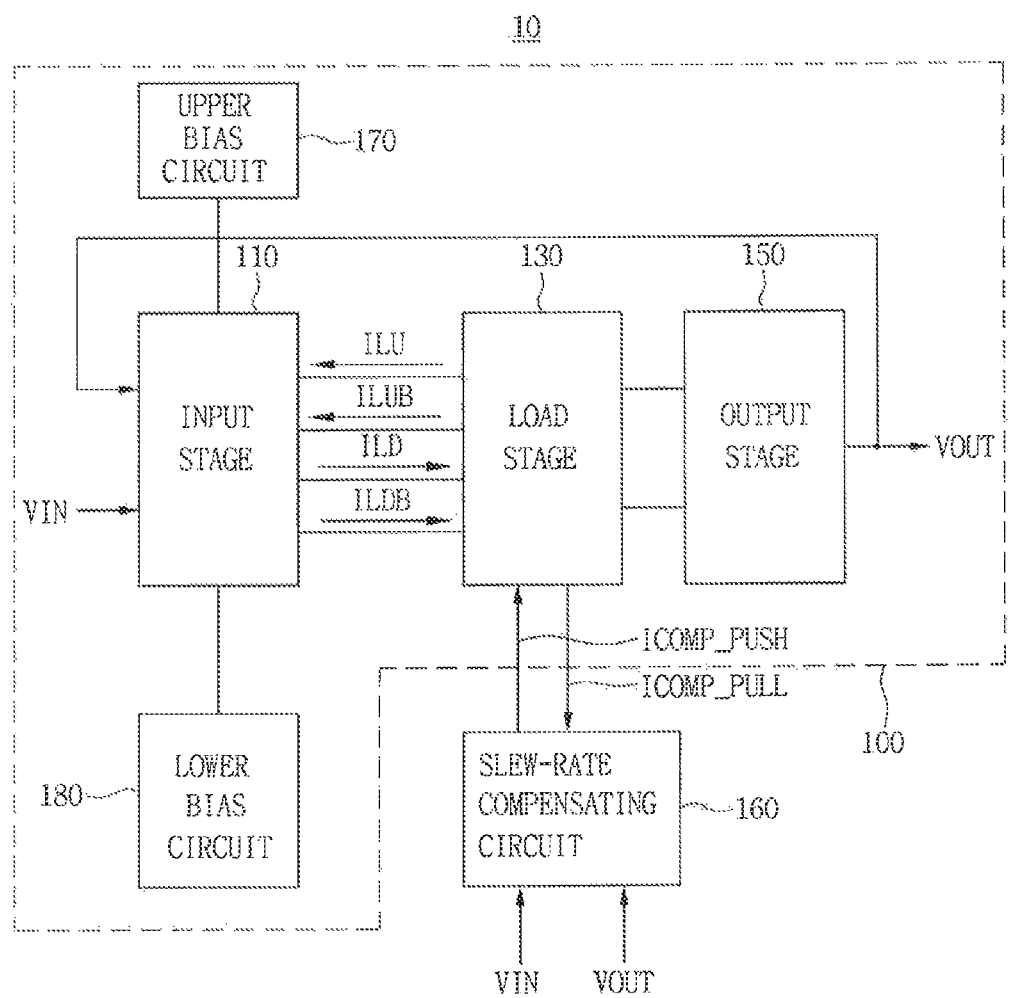
FIG. 1 is a block diagram illustrating a buffer circuit according to an exemplary embodiment of the present inventive concept.

Exemplary embodiments of the present inventive concept will be described more fully with reference to the accompanying drawings. The present inventive concept may, however, be embodied in different forms and should not be construed as being limited to the embodiments set forth herein. Rather, these exemplary embodiments are provided so that this disclosure will be thorough and complete, and will fully convey the scope of the present inventive concept. In the drawings, the sizes and relative sizes of layers and regions may be exaggerated for clarity.

It will be understood that when an element or layer is referred to as being "on," "connected to" or "coupled with" another element or layer, it can be directly on, connected or coupled to the other element or layer or intervening elements or layers may be present. Like numerals may refer to like elements throughout the specification and drawings. As used herein, the singular forms "a," "an" and "the" are intended to include the plural forms as well, unless the context clearly indicates otherwise.

FIG. 1 is a block diagram illustrating a buffer circuit according to an exemplary embodiment of the present inventive concept.

Referring to FIG. 1, the buffer circuit 10 may include an operational amplifier 100 and a slew-rate compensating circuit 160. The operational amplifier 100 shown in FIG. 1 may have a rail-to-rail structure that includes double input stages.

The operational amplifier 100 may include an input stage 110, a load stage 130, an output stage 150, an upper bias circuit 170, and a lower bias circuit 180.

The operational amplifier 100 amplifies an input voltage signal VIN to generate an output voltage signal VOUT. The slew-rate compensating circuit 160 generates a compensation current based on a voltage difference between the input voltage signal VIN and the output voltage signal VOUT, provides the compensation current to the load stage 130 of the operational amplifier 100, and reduces a transition time of the output voltage signal VOUT.

The input stage 110 receives the input voltage signal VIN and the output voltage signal VOUT, and determines a voltage difference between the input voltage signal VIN and the output voltage signal VOUT. The load stage 130 performs a slew-rate compensating operation using a pull compensation current ICOMP_PULL and a push compensation current ICOMP_PUSH, generates load currents ILU, ILUB, ILD, and ILDB corresponding to the voltage difference between the input voltage signal VIN and the output voltage signal VOUT, and provides the load currents ILU, ILUB, ILD, and ILDB to the input stage 110. The upper bias circuit 170 and the lower bias circuit 180 provide bias currents to the input stage 110.

Figure 2:
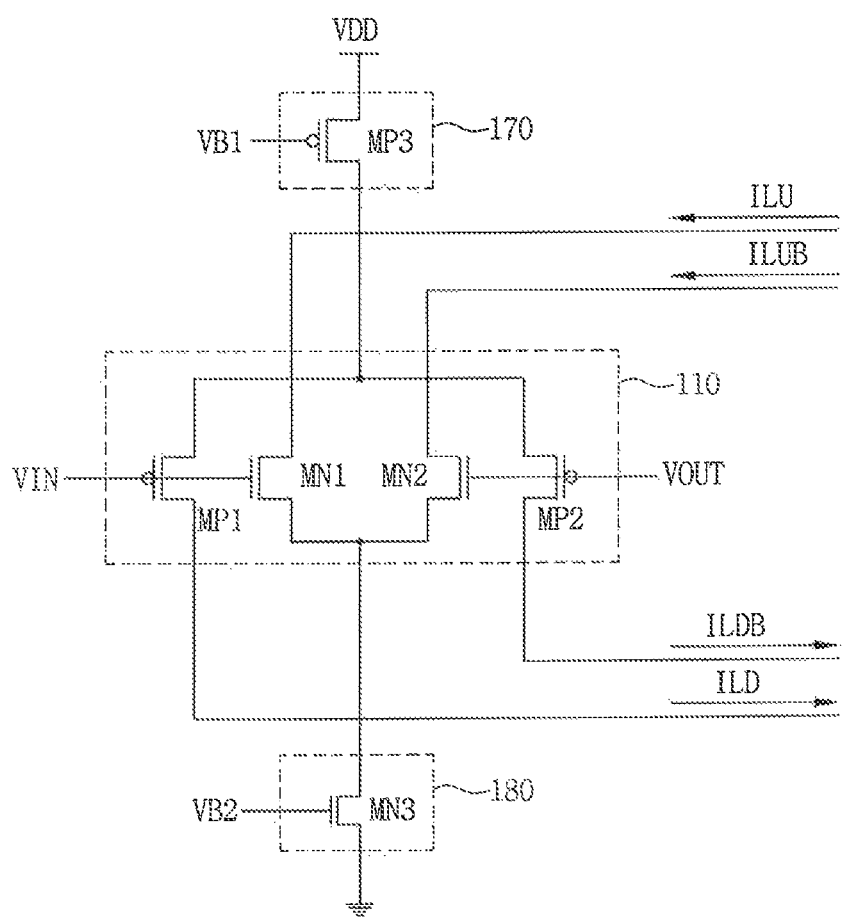
FIG. 2 is a circuit diagram illustrating an example of an input stage and bias circuits included in the buffer circuit of FIG. 1.

FIG. 2 is a circuit diagram illustrating an example of an input stage 110 and bias circuits 170 and 180 included in the buffer circuit 10 of FIG. 1.

Referring to FIG. 2, the input stage 110 may include a first input stage and a second input stage. The first input stage may include P channel metal-oxide-semiconductor (hereinafter, referred to as "PMOS") transistors MP1 and MP2, and may receive a pulling load current ILD and ILDB from the load stage 130. The second input stage may include N channel metal-oxide-semiconductor (hereinafter, referred to as "NMOS") transistors MN1 and MN2, and may receive a pushing load current ILU and ILUB from the load stage 130.

The upper bias circuit 170 may generate a first bias current based on a first bias voltage VB1 and may provide the first bias current to the first input stage, and the lower bias circuit 180 may generate a second bias current based on a second bias voltage VB2 and may provide the second bias current to the second input stage.

Figure 3:
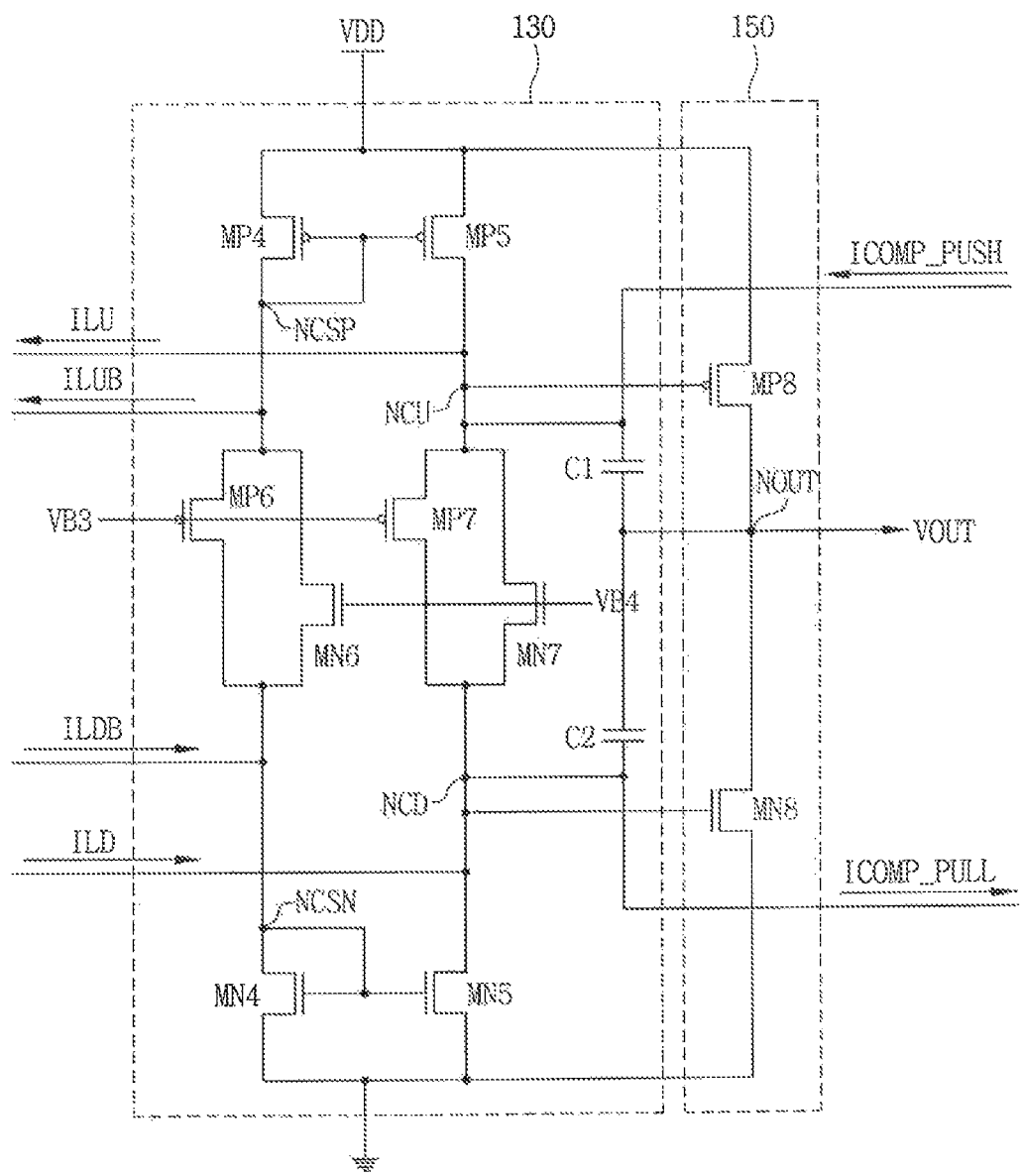
FIG. 3 is a circuit diagram illustrating an example of a load stage and an output stage included in the buffer circuit of FIG. 1.

FIG. 3 is a circuit diagram illustrating an example of a load stage 130 and an output stage 150 included in the buffer circuit 10 of FIG. 1.

Referring to FIG. 3, the load stage 130 may include an upper current mirror circuit, a lower current mirror circuit, a first connecting circuit, a second connecting circuit, a first capacitor C1, and a second capacitor C2.

The upper current mirror circuit may include PMOS transistors MP4 and MP5 that are connected in a current-mirror form to each other, and the lower current mirror circuit may include NMOS transistors MN4 and MN5 that are connected in a current-mirror form to each other. The first connecting circuit may include a PMOS transistor MP7 and an NMOS transistor MN7. The PMOS transistor MP7 and the NMOS transistor MN7 operate in response to a third bias voltage VB3 and a fourth bias voltage VB4, respectively. The second connecting circuit may include a PMOS transistor MP6 and an NMOS transistor MN6. The PMOS transistor MP6 and the NMOS transistor MN6 operate in response to the third bias voltage VB3 and the fourth bias voltage VB4, respectively.

The upper current mirror circuit is electrically connected to the second input stage and provides a current to the load stage 130. The lower current mirror circuit electrically is connected to the first input stage and provides a current to the load stage 130. The first connecting circuit electrically connects a first output terminal NCU of the upper current mirror circuit and a first output terminal NCD of the lower current mirror circuit. The second connecting circuit electrically connects a second output terminal NCSP of the upper current mirror circuit and a second output terminal NCSN of the lower current mirror circuit. The first capacitor C1 is connected between the first output NCU terminal of the upper current mirror circuit and an output terminal NOUT of the output stage 150. The second capacitor C2 is connected between the first output terminal NCD of the lower current mirror circuit and the output terminal NOUT of the output stage 150.

The output stage 150 may include a PMOS transistor MP8. A gate of the PMOS transistor MP8 is connected to the first output NCU terminal of the upper current mirror circuit, and the PMOS transistor MP8 is connected between the supply voltage VDD and the output terminal NOUT. The output stage may further include an NMOS transistor MN8. A gate of the NMOS transistor MN8 is connected to the first output terminal NCD of the lower current mirror circuit, and the NMOS transistor MN8 is connected between the output terminal NOUT and the ground.

The push compensation current ICOMP_PUSH may be provided to the first output terminal NCU of the upper current mirror circuit, and the pull compensation current ICOMP_PULL may be provided to the first output terminal NCD of the lower current mirror circuit. The pushing load current ILU may flow from the first output terminal NCU of the upper current mirror circuit to the second input stage including the NMOS transistors MN1 and MN2 of the input stage 110. The pushing load current ILUB may flow from the second output terminal NCSP of the upper current mirror circuit to the second input stage included in the input stage 110. The pulling load current ILD may flow from the first input stage including the PMOS transistors MP1 and MP2 of the input stage 110 to the first output terminal NCD of the lower current mirror circuit. The pulling load current ILDB may flow from the first input stage included in the input stage 110 to the second output terminal NCSN of the lower current mirror circuit.

Figure 4:
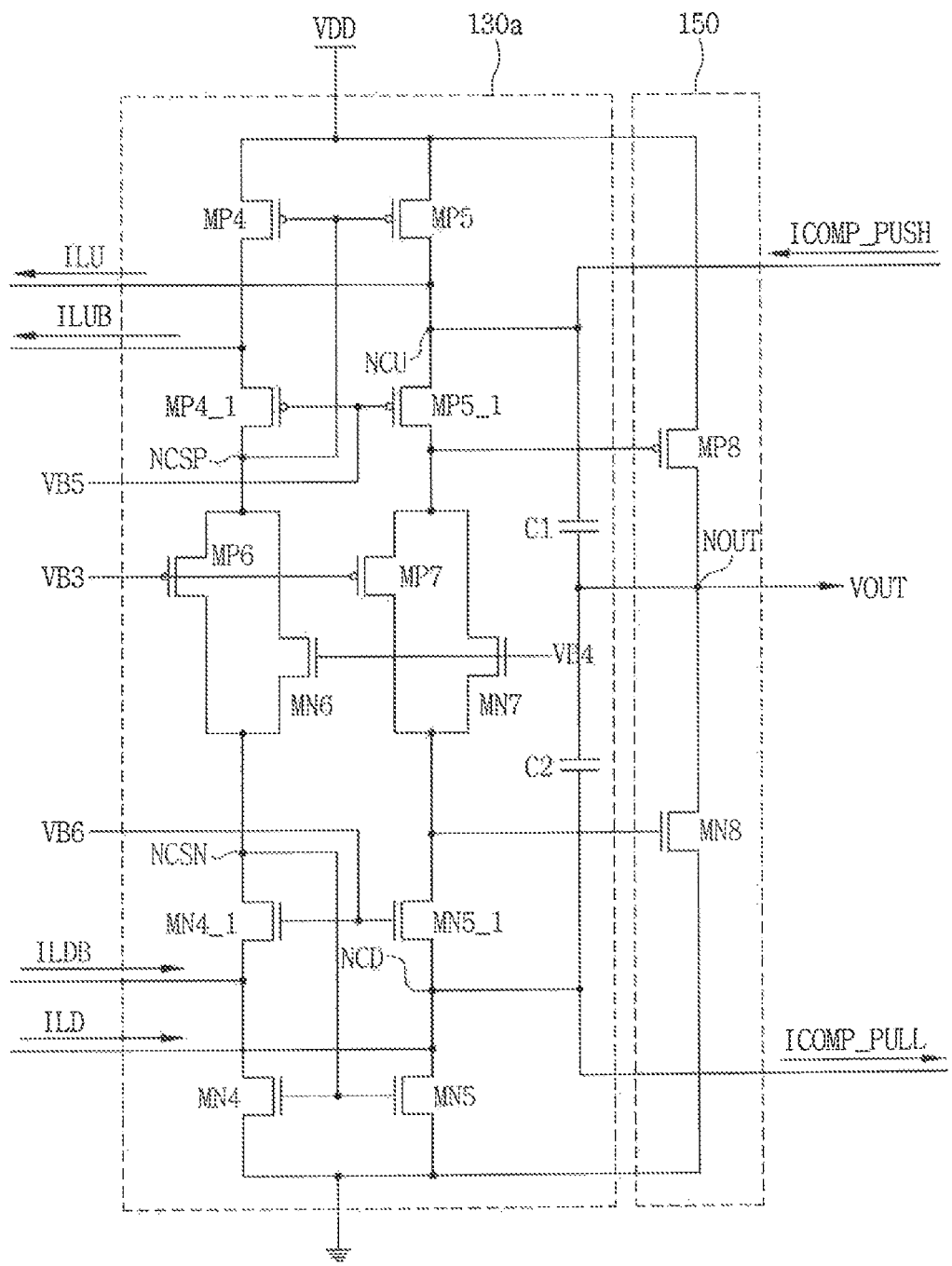
FIG. 4 is a circuit diagram illustrating an example of a load stage and an output stage included in the buffer circuit of FIG. 1.

FIG. 4 is a circuit diagram illustrating an example of a load stage and an output stage included in the buffer circuit 10 of FIG. 1.

The load stage 130a in FIG. 4 may include an upper cascode circuit that includes PMOS transistors MP4_1 and MP5_1 and operates in response to a bias voltage VB5. The upper cascode circuit is coupled between the upper current mirror circuit including the PMOS transistors MP4 and MP5 and the first and second connecting circuits. Further, the load stage 130a in FIG. 4 may include a lower cascode circuit that includes NMOS transistors MN4_1 and MN5_1 and operates in response to a bias voltage VB6. The lower cascode circuit is coupled between the lower current mirror circuit including the NMOS transistors MN4 and MN5 and the connecting circuits.

The load stage 130a shown in FIG. 4 may have similar structure to that of the load stage 130 shown in FIG. 3 except the upper cascode circuit and the lower cascode circuit. Thus, the load stage 130a shown in FIG. 4 may operate similarly to the load stage 130 shown in FIG. 3. Since the load stage 130a including the upper and lower cascode circuits may have a high output impedance, an operational amplifier and a buffer circuit including the load stage 130a may obtain a high voltage gain.

Figure 5:
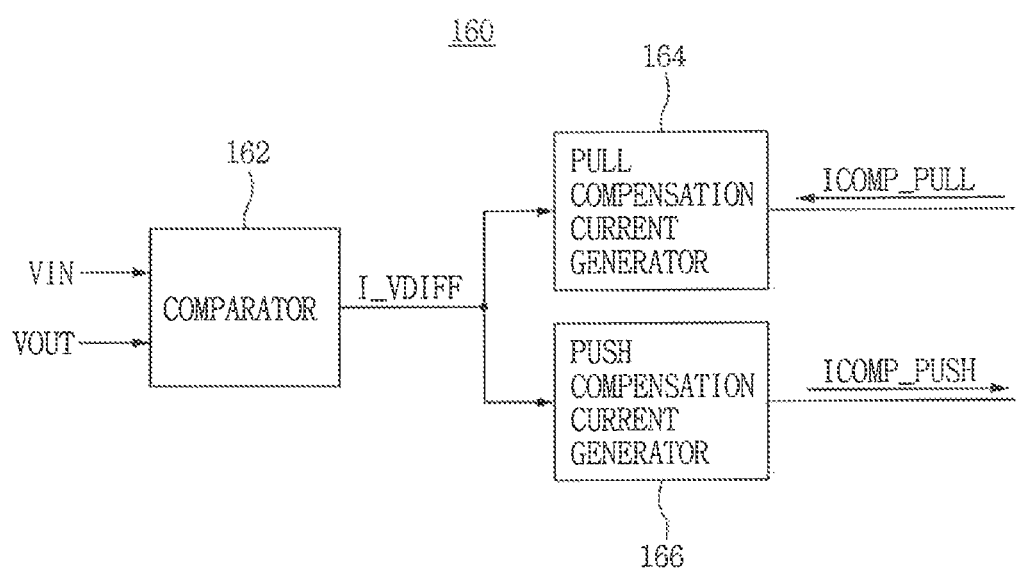
FIG. 5 is a block diagram illustrating an example of a slew-rate compensating circuit included in the buffer circuit of FIG. 1.

FIG. 5 is a block diagram illustrating an example of a slew-rate compensating circuit 160 included in the buffer circuit 10 of FIG. 1.

Referring to FIG. 5, the slew-rate compensating circuit 160 may include a comparator 162, a pull compensation current generator 164, and a push compensation current generator 166.

The comparator 162 compares the input voltage signal VIN with the output voltage signal VOUT to generate a first current I_VDIFF corresponding to a difference between the input voltage signal VIN and the output voltage signal VOUT. The pull compensation current generator 164 performs a current-mirror operation on the first current I_VDIFF to generate the pull compensation current ICOMP_PULL. The push compensation current generator 166 performs the current-mirror operation on the first current I_VDIFF to generate the push compensation current ICOMP_PUSH.

Figure 6:
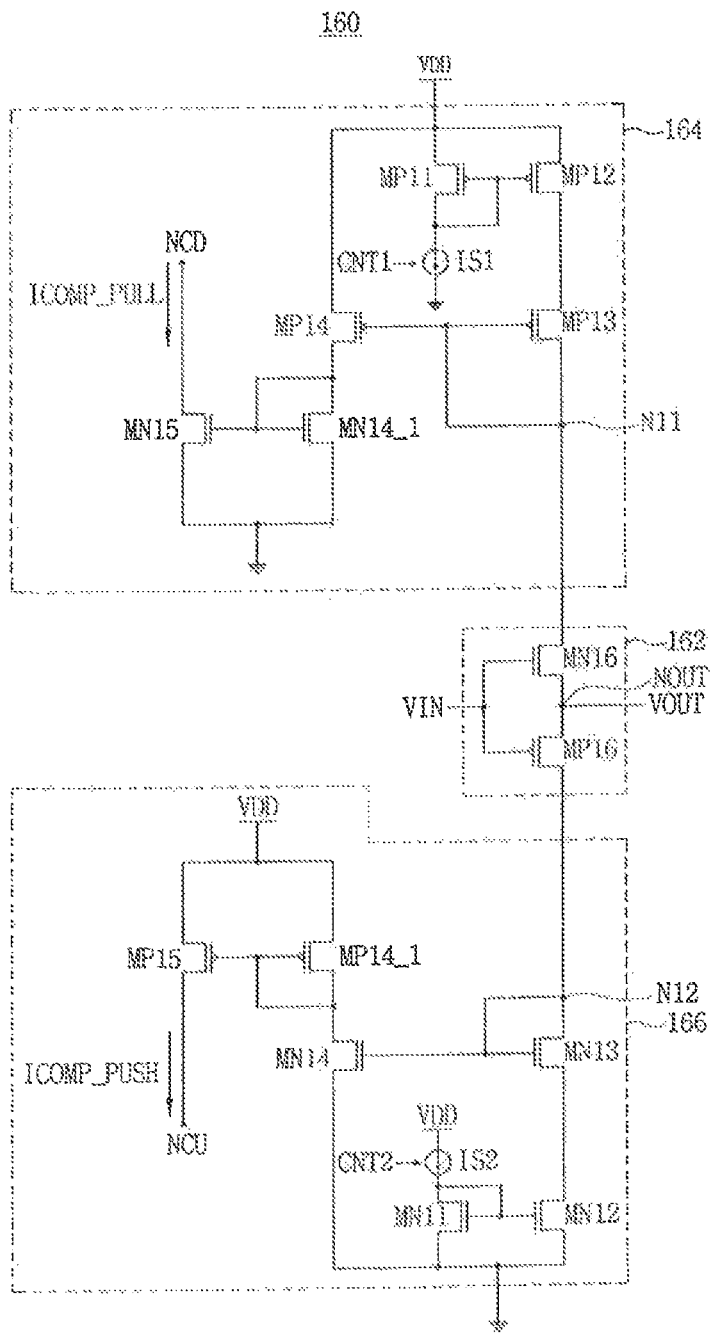
FIG. 6 is a circuit diagram illustrating the slew-rate compensating circuit of FIG. 5 in detail.

FIG. 6 is a circuit diagram illustrating the slew-rate compensating circuit 160 of FIG. 5 in detail.

Referring to FIG. 6, the comparator 162 may include an NMOS transistor MN16 and a PMOS transistor MP16. The NMOS transistor MN16 has a gate to which the input voltage signal VIN is applied, a source to which the output voltage signal VOUT is applied, and a drain connected to a first node N11. The PMOS transistor MP16 has a gate to which the input voltage signal VIN is applied, a source to which the output voltage signal VOUT is applied, and a drain connected to a second node N12.

The pull compensation current generator 164 may include a first current source IS1, a PMOS transistor MP11, a PMOS transistor MP12, a PMOS transistor MP13, a PMOS transistor MP14, an NMOS transistor MN14_1, and an NMOS transistor MN15.

The first current source IS1 generates a first supply current whose magnitude is adjusted in response to a first control signal CNT1. The PMOS transistor MP11 has a source connected to a supply voltage VDD, and a drain and a gate that are commonly connected to the first current source IS1. The PMOS transistor MP12 has a source connected to the supply voltage VDD, and a gate connected to the gate of the PMOS transistor MP11. The PMOS transistor MP13 has a source connected to a drain of the PMOS transistor MP12, and a drain and a gate that are commonly connected to the first node N11. The PMOS transistor MP14 has a source connected to the supply voltage VDD, and a gate connected to the gate of the PMOS transistor MP13. The NMOS transistor MN14_1 has a drain and a gate that are commonly connected to a drain of the PMOS transistor MP14, and a source connected to the ground. The NMOS transistor MN15 has a gate connected to the gate of the NMOS transistor MN14_1, a source connected to the ground, and a drain from which the pull compensation current ICOMP_PULL is output.

The push compensation current generator 166 may include a second current source IS2, an NMOS transistor MN11, an NMOS transistor MN12, an NMOS transistor MN13, an NMOS transistor MN14, a PMOS transistor MP14_1, and a PMOS transistor MP15.

The second current source IS2 generates a second supply current whose magnitude is adjusted in response to a second control signal CNT2. The NMOS transistor MN11 has a source connected to the ground, and a drain and a gate that are commonly connected to the second current source IS2. The NMOS transistor MN12 has a source connected to the ground, and a gate connected to the gate of the NMOS transistor MN11. The NMOS transistor MN13 has a source connected to a drain of the NMOS transistor MN12, and a drain and a gate that are commonly connected to the second node N12. The NMOS transistor MN14 has a source connected to the ground and a gate connected to the gate of the NMOS transistor MN13. The PMOS transistor MP14_1 has a drain and a gate that are commonly connected to a drain of the NMOS transistor MN14, and a source connected to the supply voltage VDD. The PMOS transistor MP15 has a gate connected to the gate of the PMOS transistor MP14_1, a source connected to the supply voltage VDD, and a drain from which the push compensation current ICOMP_PUSH is output.

Figure 7:
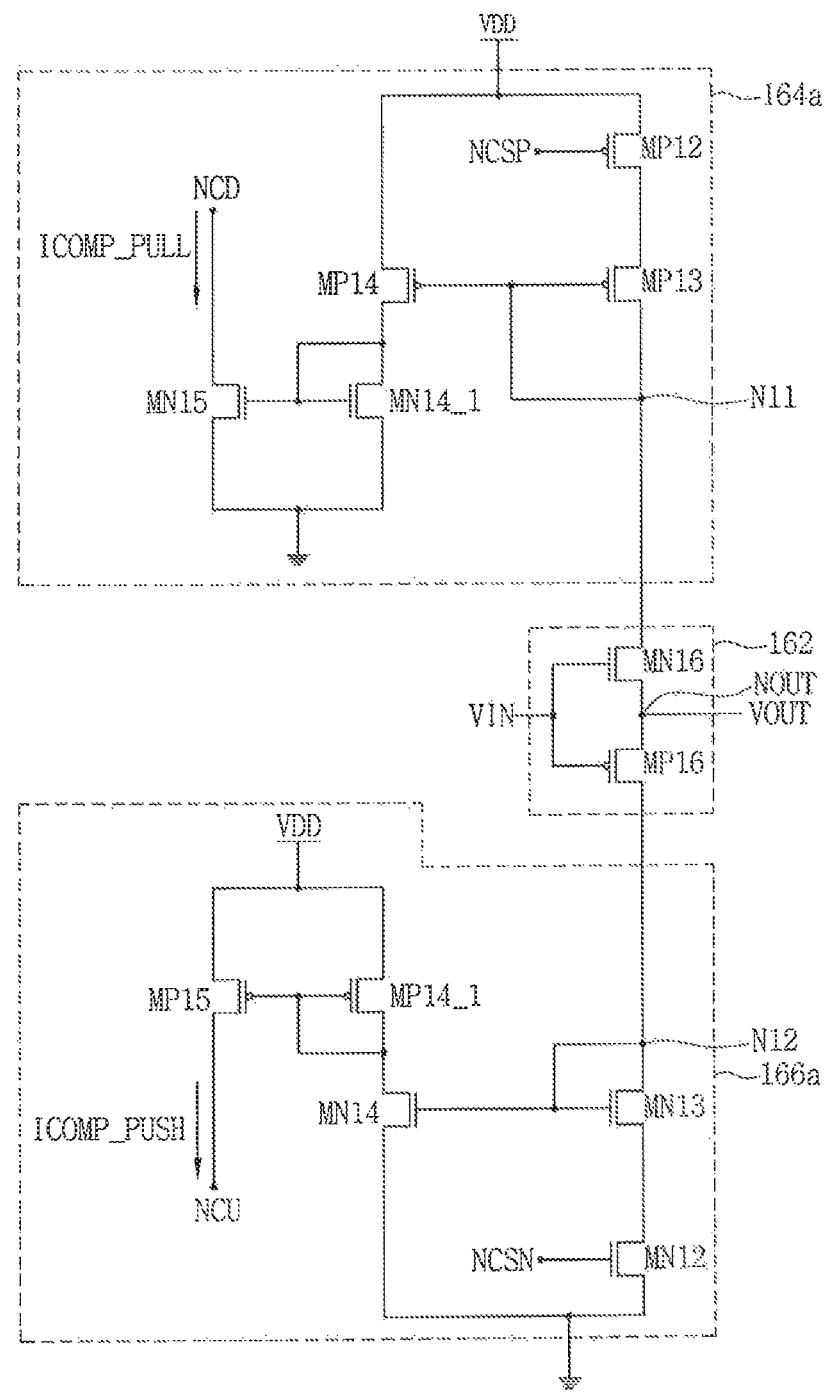
FIG. 7 is a circuit diagram illustrating an example of a slew-rate compensating circuit included in the buffer circuit of FIG. 1.

FIG. 7 is a circuit diagram illustrating an example of a slew-rate compensating circuit included in the buffer circuit 10 of FIG. 1.

Referring to FIG. 7, the pull compensation current generator 164a of a slew-rate compensating circuit 160a may include a PMOS transistor MP12, a PMOS transistor MP13, a PMOS transistor MP14, an NMOS transistor MN14_1, and an NMOS transistor MN15.

The PMOS transistor MP12 has a source connected to a supply voltage VDD, and a gate connected to an output terminal NCSP of the upper current mirror circuit included in the load stage 130 of the operational amplifier 100. The PMOS transistor MP13 has a source connected to a drain of the PMOS transistor MP12, a gate and a drain that are commonly connected to the first node N11. The PMOS transistor MP14 has a source connected to the supply voltage VDD, and a gate connected to the gate of the PMOS transistor MP13. The NMOS transistor MN14_1 has a drain and a gate that are commonly connected to a drain of the PMOS transistor MP14, and a source connected to the ground. The NMOS transistor MN15 has a gate connected to the gate of the NMOS transistor MN14_1, a source connected to the ground, and a drain from which the pull compensation current ICOMP_PULL is output.

The push compensation current generator 166a may include an NMOS transistor MN12, an NMOS transistor MN13, an NMOS transistor MN14, a PMOS transistor MP14_1, and a PMOS transistor MP15.

The NMOS transistor MN12 has a source connected to the ground and a gate connected to an output terminal NCSN of the lower current mirror circuit included in the load stage 130 of the operational amplifier 100. The NMOS transistor MN13 has a source connected to a drain of the first NMOS transistor MN12 and a drain and a gate that are commonly connected to the second node N12. The NMOS transistor MN14 has a source connected to the ground, and a gate connected to the gate of the NMOS transistor MN13. The PMOS transistor MP14_1 has a drain and a gate that are commonly connected to a drain of the NMOS transistor MN14, and a source connected to the supply voltage VDD. The PMOS transistor MP15 has a gate connected to the gate of the PMOS transistor MP14_1, a source connected to the supply voltage VDD, and a drain from which the push compensation current ICOMP_PUSH is output.

Figure 8:
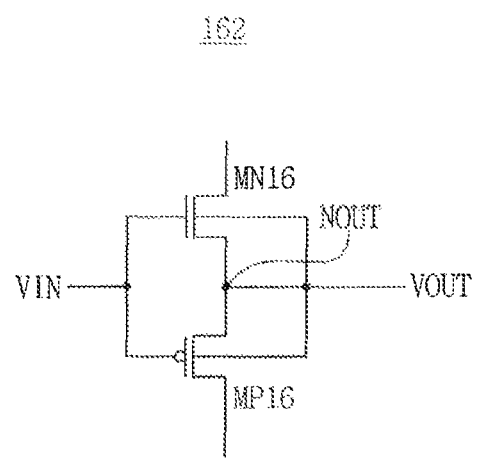
FIG. 8 is a circuit diagram illustrating an example of a comparator included in FIGS. 5 to 7.

FIG. 8 is a circuit diagram illustrating an example of a comparator 162 included in FIGS. 5 to 7. Referring to FIG. 6, the comparator 162 may include an NMOS transistor MN16 and a PMOS transistor MP16. The NMOS transistor MN16 has a gate to which the input voltage signal VIN is applied, a source to which the output voltage signal VOUT is applied, and a drain connected to the first node N11. The PMOS transistor MP16 has a gate to which the input voltage signal is applied, a source to which the output voltage signal VOUT is applied, a drain connected to the second node N12.

Referring to FIG. 8, a body of the NMOS transistor MN16 may be electrically connected to the source of the NMOS transistor MN16, and a body of the PMOS transistor MP16 may be electrically connected to the source of the PMOS transistor MP16. Further, the body of the NMOS transistor MN16 may be electrically connected to the body of the PMOS transistor MP16.

As shown in FIG. 8, when a body (or bulk) of an NMOS transistor or a body of a PMOS transistor is electrically connected to a source of the NMOS transistor or the PMOS transistor, a threshold voltage of the NMOS transistor or the PMOS transistor may have a constant value even when a back-bias voltage of the NMOS transistor or the PMOS transistor varies.

Hereinafter, the operation of the buffer circuit 10 according to an exemplary embodiment of the present inventive concept will be described.

The buffer circuit 10 may increase a slew-rate of the output voltage signal VOUT of the buffer circuit 10 using the slew-rate compensating circuit 160 shown in FIG. 5 or the slew-rate compensating circuit 160a shown in FIG. 6. For example, when a magnitude of the input voltage signal VIN becomes larger than a magnitude of the output voltage signal VOUT by a threshold voltage of a metal-oxide-semiconductor (MOS) transistor (e.g., NMOS transistor MN16 or PMOS transistor MP16), a magnitude of the pulling load current ILD of the first input stage including the PMOS transistors MP1 and MP2 of the input stage 110 is decreased and a magnitude of the pulling load current ILDB is increased. In this condition, a magnitude of the pushing load current ILU of the second input stage including the NMOS transistors MN1 and MN2 of the input stage 110 is increased and a magnitude of the pushing load current ILUB is decreased. In this condition, a voltage of the first output terminal NCU of the upper current mirror circuit of the load stage 130 is decreased, a voltage of the second output terminal NCSP of the upper current mirror circuit of the load stage 130 is increased, a voltage of the first output terminal NCD of the lower current mirror circuit of the load stage 130 is decreased, and a voltage of the second output terminal NCSN of the lower current mirror circuit of the load stage 130 is increased. For example, when the magnitude of the input voltage signal VIN becomes larger than a magnitude of the output voltage signal VOUT by a threshold voltage of a MOS transistor (e.g., NMOS transistor MN16 or PMOS transistor MP16), the voltage of the first output terminal NCU of the upper current mirror circuit of the load stage 130 is decreased and the voltage of the first output terminal NCD of the lower current mirror circuit of the load stage 130 is decreased.

For example, when the magnitude of the input voltage signal VIN becomes larger than a magnitude of the output voltage signal VOUT by a threshold voltage of a MOS transistor (e.g., NMOS transistor MN16 or PMOS transistor MP16), the NMOS transistor MN16 included in the comparator 162 of FIG. 6 has an on-state and the PMOS transistor MP16 has an off-state. Thus, the pull compensation current generator 164 is activated, and the pull compensation current ICOMP_PULL which is an output of the pull compensation current generator 164 is provided to the first output terminal NCD of the lower current mirror circuit of the load stage 130. The pull compensation current ICOMP_PULL may flow from the first output terminal NCD of the lower current mirror circuit of the load stage 130 to the NMOS transistor MN15 included in the pull compensation current generator 164. For example, the pull compensation current generator 164 pulls the pull compensation current ICOMP_PULL. Thus, the voltage of the first output terminal NCD of the lower current mirror circuit of the load stage 130 becomes further lower by the pull compensation current ICOMP_PULL. Thus, the NMOS transistor MN8 included in the output stage 150 rapidly turns off, and a rising time of the output voltage signal VOUT becomes shorter by the pull compensation current ICOMP_PULL When the magnitude of the input voltage signal VIN becomes larger than a magnitude of the output voltage signal VOUT by a threshold voltage of a MOS transistor (e.g., NMOS transistor MN16 or PMOS transistor MP16), the PMOS transistor MP16 included in the comparator 162 of FIG. 6 has an off-state. Thus, the push compensation current generator 166 is deactivated and the push compensation current ICOMP_PUSH which is an output of the push compensation current generator 166 is not provided to the load stage 130.

For example, when the magnitude of the output voltage signal VOUT becomes larger than a magnitude of the input voltage signal VIN by a threshold voltage of a MOS transistor (e.g., NMOS transistor MN16 or PMOS transistor MP16), the magnitude of the pulling load current ILD of the first input stage comprised of PMOS transistors MP1 and P2 included in the input stage 110 is increased, and the pulling load current ILDB is decreased. In this condition, the magnitude of the pushing load current ILU of the second input stage including the NMOS transistors MN1 and MN2 of the input stage 110 is decreased, and the pushing load current ILUB is increased. In this condition, a voltage of the first output terminal NCU of the upper current mirror circuit of the load stage 130 is increased and a voltage of the second output terminal NCSP of the upper current mirror circuit of the load stage 130 is decreased. Further, a voltage of the first output terminal NCD of the lower current mirror circuit of the load stage 130 is increased and a voltage of the second output terminal NCSN of the lower current mirror circuit of the load stage 130 is decreased. For example, when the magnitude of the output voltage signal VOUT becomes larger than a magnitude of the input voltage signal VIN by a threshold voltage of a MOS transistor (e.g., NMOS transistor MN16 or PMOS transistor MP16), the voltage of the first output terminal NCU of the upper current mirror circuit of the load stage 130 is increased and the voltage of the first output terminal NCD of the lower current mirror circuit of the load stage 130 is increased.

For example, when the magnitude of the output voltage signal VOUT becomes larger than a magnitude of the input voltage signal VIN by a threshold voltage of a MOS transistor (e.g., NMOS transistor MN16 or PMOS transistor MP16), the NMOS transistor MN16 included in the comparator 162 of FIG. 6 has an off-state and the PMOS transistor MP16 has an on-state. Thus, the push compensation current generator 166 is activated, and the push compensation current ICOMP_PUSH which is an output of the push compensation current generator 166 is provided to the first output terminal NCU of the upper current mirror circuit of the load stage 130. The push compensation current ICOMP_PUSH may flow from the PMOS transistor MP15 included in the push compensation current generator 166 to the first output terminal NCU of the upper current mirror circuit of the load stage 130. For example, the push compensation current generator 166 pushes the push compensation current ICOMP_PUSH. Thus, the voltage of the first output terminal NCU of the upper current mirror circuit of the load stage 130 becomes further higher by the push compensation current ICOMP_PUSH. Thus, the PMOS transistor MP8 included in the output stage 150 rapidly turns off, and a falling time of the output voltage signal VOUT becomes shorter by the push compensation current ICOMP_PUSH.

When the magnitude of the output voltage signal VOUT becomes larger than a magnitude of the input voltage signal VIN by a threshold voltage of a MOS transistor (e.g., NMOS transistor MN16 or PMOS transistor MP16), the NMOS transistor MN16 included in the comparator 162 of FIG. 6 has an of state. Thus, the pull compensation current generator 164 is deactivated and the pull compensation current ICOMP_PULL which is an output of the pull compensation current generator 164 is not provided to the load stage 130.

As described above, the buffer circuit according to an exemplary embodiment of the present inventive concept may enhance a slew-rate of the output voltage signal by activating the slew-rate compensating circuit when the output voltage signal is in transition.

Figure 9:
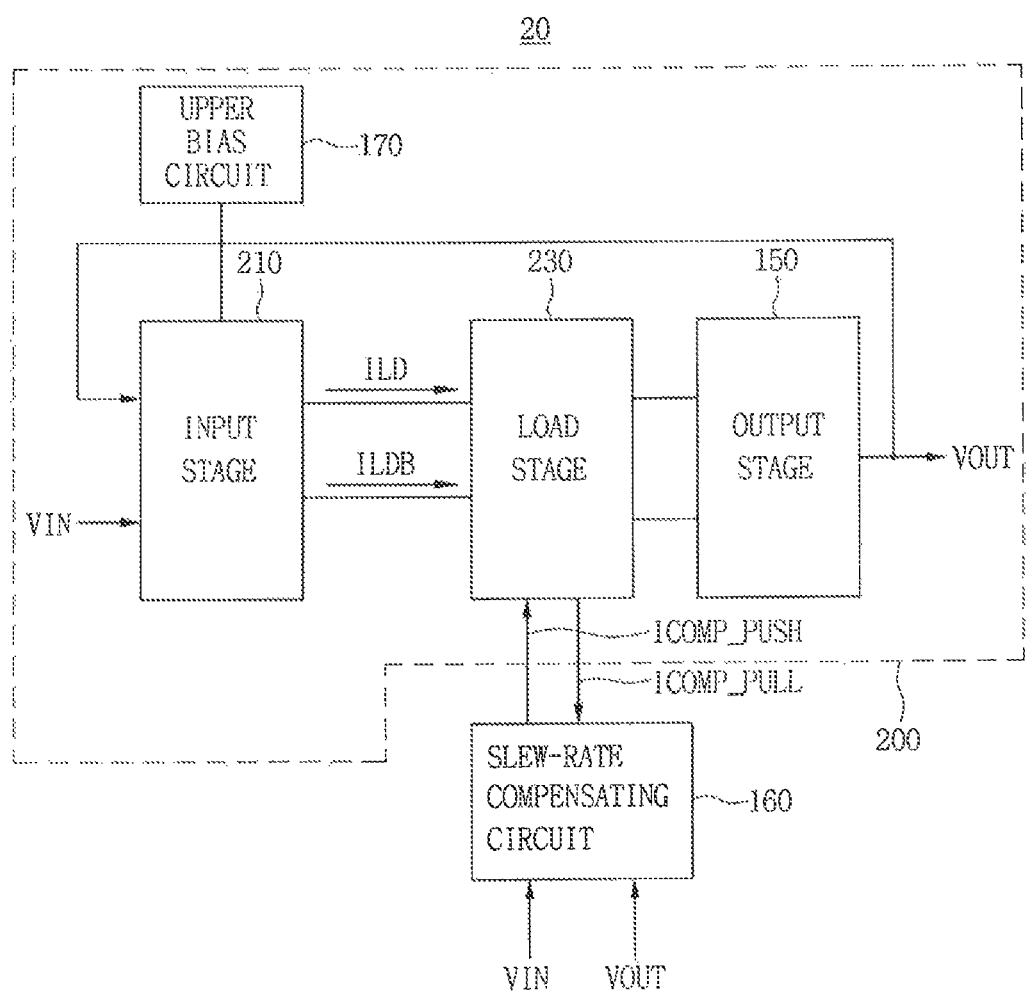
FIG. 9 is a block diagram illustrating a buffer circuit according to an exemplary embodiment of the present inventive concept.

FIG. 9 is a block diagram illustrating a buffer circuit according to an exemplary embodiment of the present inventive concept.

Referring to FIG. 9, the buffer circuit 20 may include an operational amplifier 200 and a slew-rate compensating circuit 160. The operational amplifier 200 shown in FIG. 9 may have a single structure of input stage, which is different from the rail-to-rail structure of the operational amplifier 100 shown in FIG. 1.

The operational amplifier 200 may include an input stage 210, a load stage 230, an output stage 150, and an upper bias circuit 170.

The load stage 230 performs a slew-rate compensating operation using a pull compensation current ICOMP_PULL and a push compensation current ICOMP_PUSH, generates load currents ILD and ILDB corresponding to the voltage difference between the input voltage signal VIN and the output voltage signal VOUT, and provides the load currents ILD and ILDB to the input stage 210. The upper bias circuit 170 provides a bias current to the input stage 210.

Figure 10:
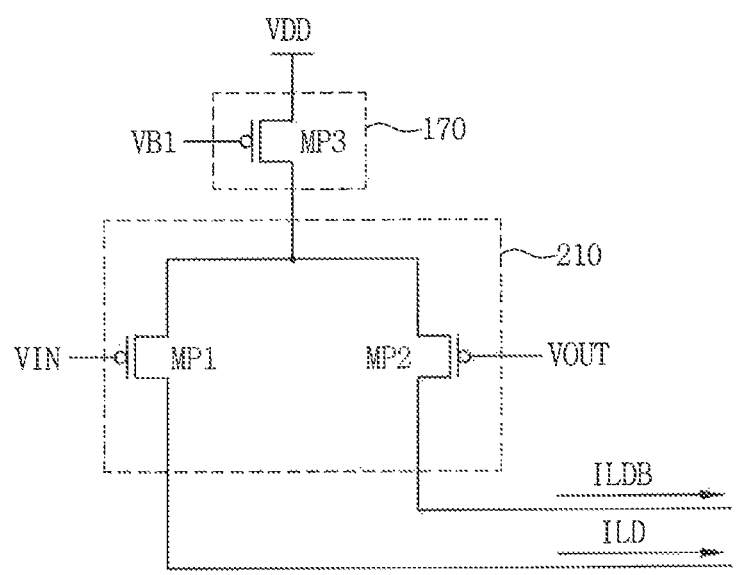
FIG. 10 is a circuit diagram illustrating an example of an input stage and an upper bias circuit included in the buffer circuit of FIG. 9.

FIG. 10 is a circuit diagram illustrating an example of an input stage 210 and an upper bias circuit 170 included in the buffer circuit 20 of FIG. 9.

Referring to FIG. 10, the input stage 210 may include PMOS transistors MP1 and MP2, and may receive the pulling load currents ILD and ILDB from the load stage 230. The pulling load currents ILD and ILDB may flow from the input stage 210 to the load stage 230. The upper bias circuit 170 may generate a first bias current based on a first bias voltage VB1 and may provide the first bias current to the input stage 210.

Figure 11:
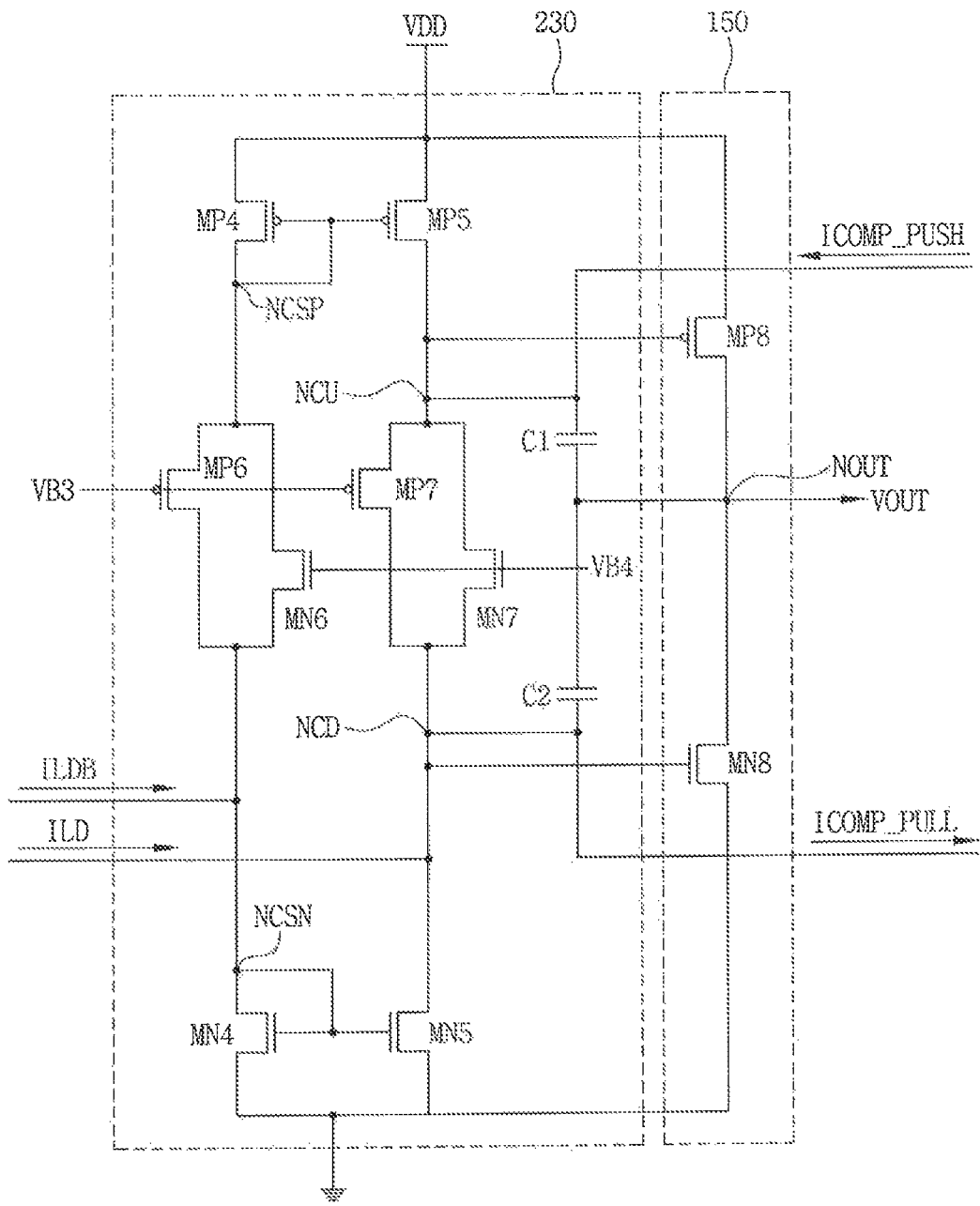
FIG. 11 is a circuit diagram illustrating an example of a load stage and an output stage included in the buffer circuit of FIG. 9.

FIG. 11 is a circuit diagram illustrating an example of a load stage 230 and an output stage 150 included in the buffer circuit 20 of FIG. 9.

The load stage 230 shown in FIG. 11 may provide only the pulling load currents ILD and ILDB to the input stage 210, but might not provide the pushing load currents ILU and ILUB, different from the load stage 130 of FIG. 3.

The pulling load current ILD may flow from the input stage 210 to the first output terminal NCD of the lower current mirror circuit, and the pulling load current ILDB may flow from the input stage 210 to the second output terminal NCSN of the lower current mirror circuit.

Figure 12:
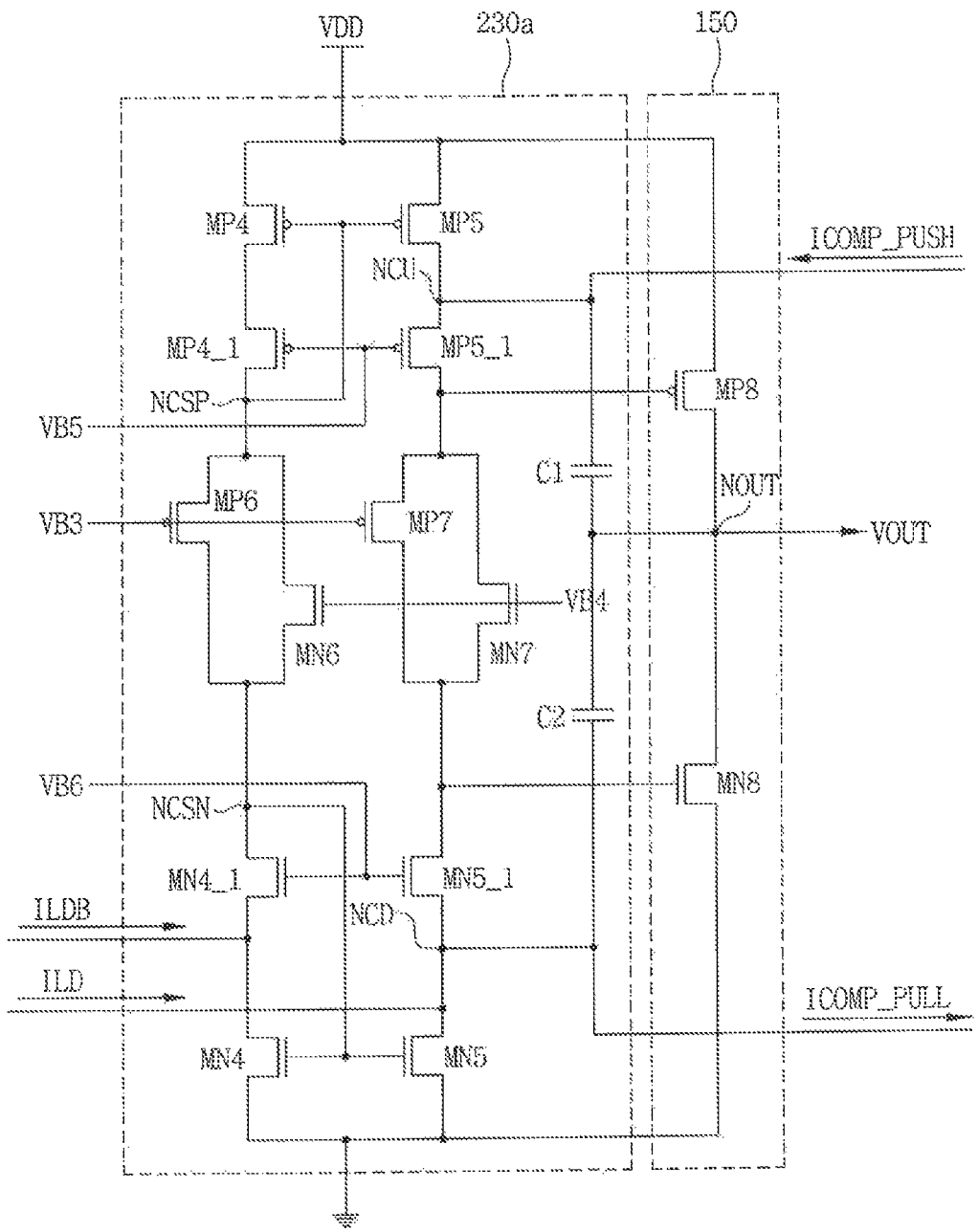
FIG. 12 is a circuit diagram illustrating an example of a load stage and an output stage included in the buffer circuit of FIG. 9.

FIG. 12 is a circuit diagram illustrating an example of a load stage and an output stage included in the buffer circuit 20 of FIG. 9.

Referring to FIG. 12, the load stage 230a shown in FIG. 12 may include the upper cascode circuit including the PMOS transistors MP4_1 and MP5_1, and the first and second connecting circuits. The PMOS transistors MP4_1, MP5_1 may operate in response to a bias voltage VB5. The upper cascode circuit may be connected between the upper current mirror circuit including the PMOS transistors MP4 and MP5 and the first and second connecting circuits. Further, the load stage 230a shown in FIG. 12 may include the lower cascode circuit including the NMOS transistors MN4_1 and MN5_1. The NMOS transistors MN4_1 and MN5_1 may operate in response to a bias voltage VB6. The lower cascode circuit is connected between the lower current mirror circuit including NMOS transistors MN4 and MN5 and the first and second connecting circuits. The load stage 230a shown in FIG. 12 may have a similar structure to that of the load stage 230 shown in FIG. 11 except the upper cascode circuit and the lower cascode circuit. Thus, the load stage 230a shown in FIG. 12 may operate similarly to the load stage 230 shown in FIG. 11. As described above, since the load stage 230a including the cascode circuits (e.g., the upper and lower cascode circuits) may have a high output impedance, an amplifier and a buffer circuit including the load stage 230a may obtain a high voltage gain.

Figure 13:
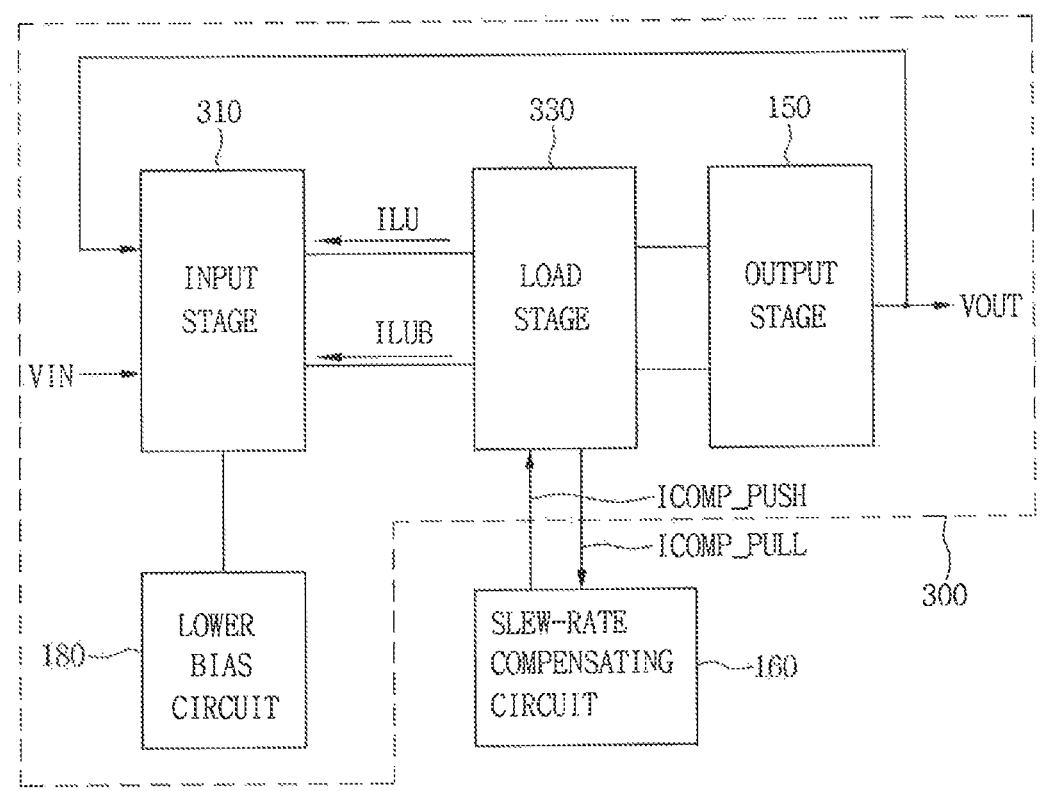
FIG. 13 is a block diagram illustrating a buffer circuit according to an exemplary embodiment of the present inventive concept.

FIG. 13 is a block diagram illustrating a buffer circuit 30 according to an exemplary embodiment of the present inventive concept.

Referring to FIG. 13, the buffer circuit 30 may include an operational amplifier 300 and a slew-rate compensating circuit 160. The operational amplifier 300 shown in FIG. 13 may have a single structure of input stage, different from the operational amplifier 100 having the rail-to-rail structure of FIG. 1.

The operational amplifier 300 may include an input stage 310, a load stage 330, an output stage 150, and a lower bias circuit 180.

The load stage 330 performs a slew-rate compensating operation using a pull compensation current ICOMP_PULL and a push compensation current ICOMP_PUSH, generates load currents ILU and ILUB corresponding to the voltage difference between the input voltage signal VIN and the output voltage signal VOUT, and provides the load currents ILU and ILUB to the input stage 310. The lower bias circuit 180 provides a bias current to the input stage 310.

Figure 14:
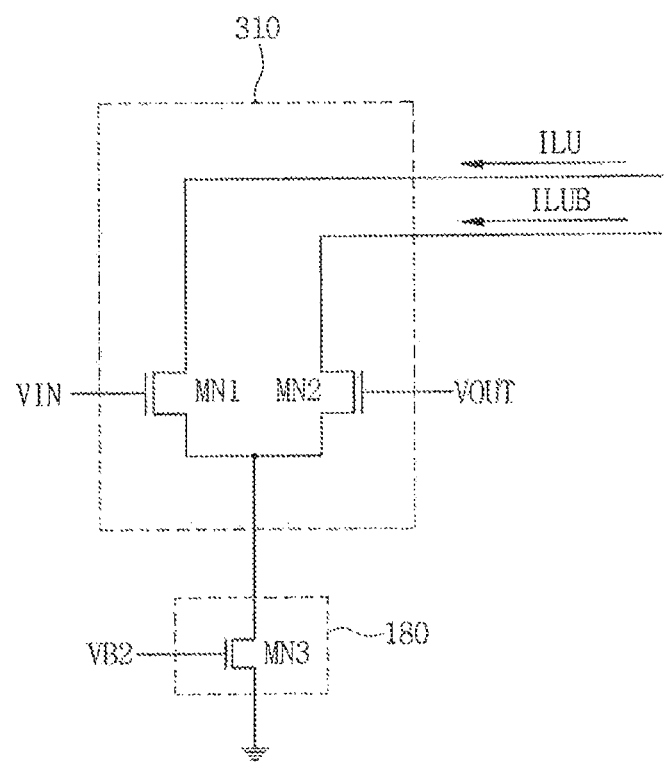
FIG. 14 is a circuit diagram illustrating an example of an input stage and a bias circuit included in the buffer circuit of FIG. 13.

FIG. 14 is a circuit diagram illustrating an example of an input stage 310 and a lower bias circuit 180 included in the buffer circuit 30 of FIG. 13.

Referring to FIG. 14, the input stage 310 may include NMOS transistors MN1 and MN2, and may receive pushing load currents ILU and ILUB from the load stage 330. The pushing load currents ILU and ILUB may flow from the load stage 330 to the input stage 310. The lower bias circuit 180 may generate a second bias current based on a second bias voltage VB2 and may provide the second bias current to the input stage 310.

Figure 15:
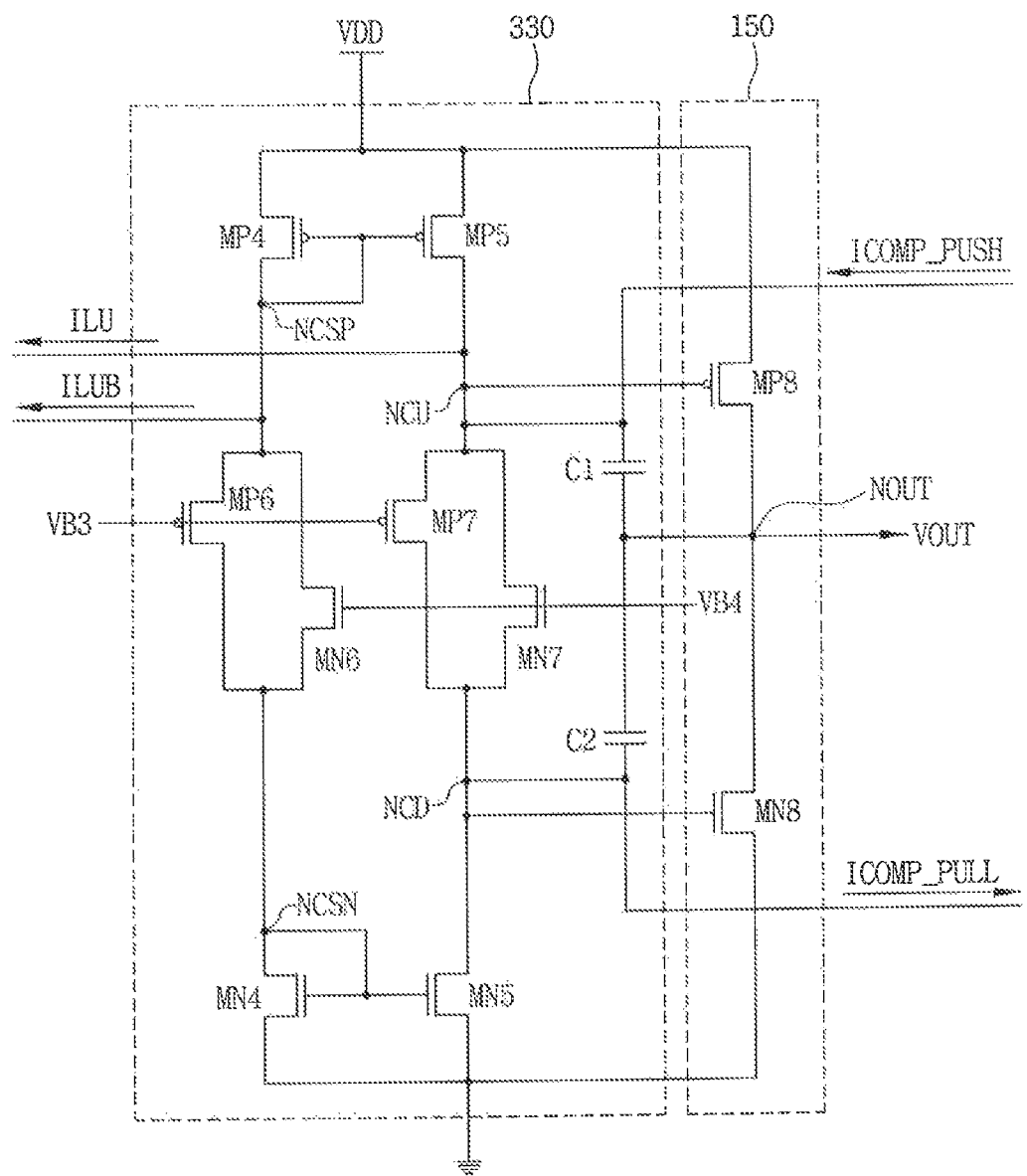
FIG. 15 is a circuit diagram illustrating an example of a load stage and an output stage included in the buffer circuit of FIG. 13.

FIG. 15 is a circuit diagram illustrating an example of a load stage 330 and an output stage 150 included in the buffer circuit 30 of FIG. 13.

The load stage 330 shown in FIG. 15 may provide only the pushing load currents ILU and ILUB to the input stage 310, but might not provide the pulling load currents ILD and ILDB, different from the load stage 130 of FIG. 3.

The pushing load current ILU may flow from the first output terminal NCU of the upper current mirror circuit to the input stage 310, and the pushing load current ILUB may flow from the second output terminal NCSP of the upper current mirror circuit to the input stage 310.

Figure 16:
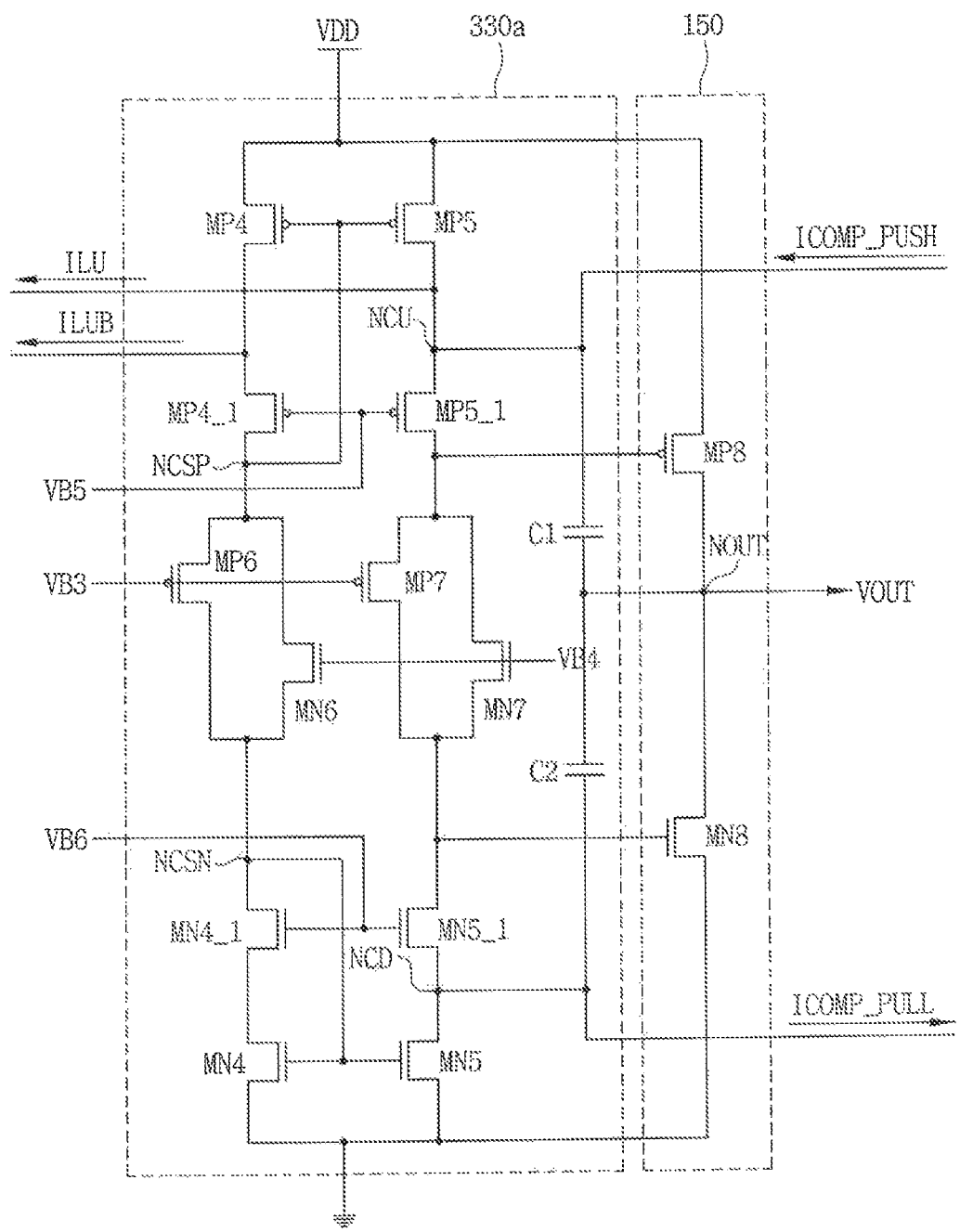
FIG. 16 is a circuit diagram illustrating an example of a load stage and an output stage included in the buffer circuit of FIG. 13.

FIG. 16 is a circuit diagram illustrating an example of a load stage and an output stage included in the buffer circuit 30 of FIG. 13.

The load stage 330a shown in FIG. 16 may include the upper cascade circuit including the PMOS transistors MP4_1 and MP5_1, and the first and second connecting circuits. The PMOS transistors MP4_1, MP5_1 may operate in response to a bias voltage VB5. The upper cascode circuit may be connected between the upper current mirror circuit including the PMOS transistors MP4 and MP5 and the first and second connecting circuits. Further, the load stage 330a shown in FIG. 16 may include the lower cascode circuit including the NMOS transistors MN4_1 and MN5_1. The NMOS transistors MN4_1 and MN5_1 may operate in response to a bias voltage VB6. The lower cascode circuit may be connected between the lower current mirror circuit including the NMOS transistors MN4 and MN5 and the first and second connecting circuits. The load stage 330a shown in FIG. 16 may have a similar structure to that of the load stage 330 shown in FIG. 15 except the upper cascode circuit and the lower cascode circuit. Thus, the load stage 330a shown in FIG. 16 may operate similarly to the load stage 330 shown in FIG. 15. As described above, since the load stage 330a including cascode circuits (e.g., lower cascode circuit and upper cascode circuit) may have a high output impedance, an amplifier and a buffer circuit including the load stage 330a may obtain a high voltage gain.

Figure 17:
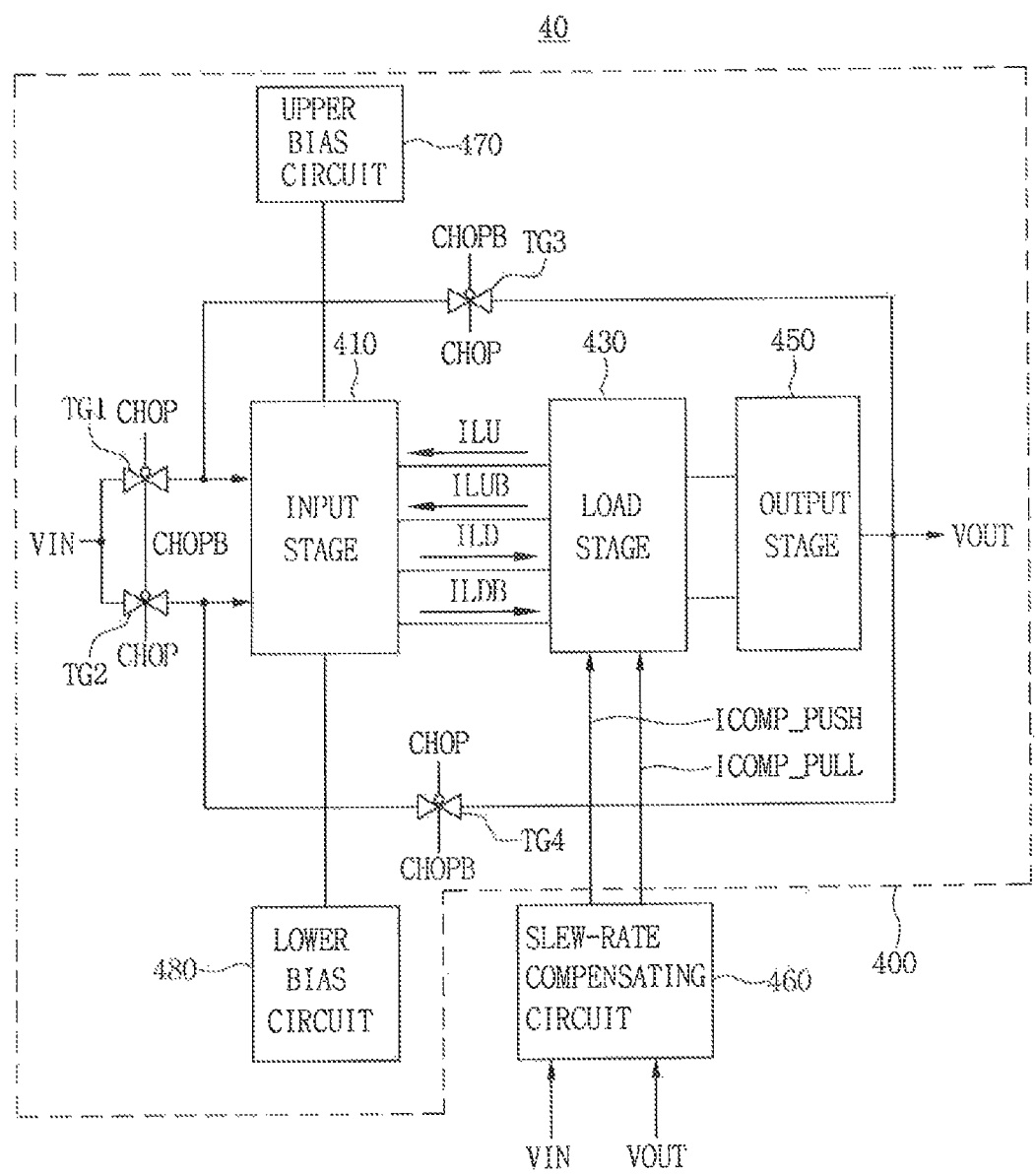
FIG. 17 is a block diagram illustrating a buffer circuit according to an exemplary embodiment of the present inventive concept.

FIG. 17 is a block diagram illustrating a buffer circuit according to an exemplary embodiment of the present inventive concept. The buffer circuit 40 of FIG. 17 may have a chopping structure.

Referring to FIG. 17, the buffer circuit 400 may include an operational amplifier 400 and a slew-rate compensating circuit 460. The operational amplifier 400 shown in FIG. 17 may have a rail-to-rail structure that includes double input stages.

The operational amplifier 400 may include an input stage 410, a load stage 430, an output stage 450, an upper bias circuit 470, a lower bias circuit 480, and transmission gates TG1, TG2, TG3, and TG4.

The operational amplifier 400 amplifies an input voltage signal VIN to generate an output voltage signal VOUT. The slew-rate compensating circuit 460 generates a compensation current based on a voltage difference between the input voltage signal VIN and the output voltage signal VOUT, provides the compensation current to the load stage 430 of the operational amplifier 400, and reduces a transition time of the output voltage signal VOUT.

The input stage 410 receives the input voltage signal VIN and the output voltage signal VOUT through the transmission gates TG1, TG2, TG3, and TG4, and determines a voltage difference between the input voltage signal VIN and the output voltage signal VOUT. The load stage 430 performs a slew-rate compensating operation using a pull compensation current ICOMP_PULL and a push compensation current ICOMP_PUSH, generates load currents ILU, ILUB, ILD, and ILDB corresponding to the voltage difference between the input voltage signal VIN and the output voltage signal VOUT, and provides the load currents ILU, ILUB, ILD, and ILDB to the input stage 410. The upper bias circuit 470 and the lower bias circuit 480 provide bias currents to the input stage 410.

The transmission gate TG1 is turned on when a chopping signal CHOP is at a logic low level, the transmission gate TG2 is turned on when the chopping signal CHOP is at a logic high level, transmission gate TG3 is turned on when the chopping signal CHOP is at a logic high level, and transmission gate TG4 is turned on when the chopping signal CHOP is at a logic low level. A chopping bar signal CHOPB is a signal having an opposite phase from the chopping signal CHOP.

For example, when the chopping signal CHOP is at a logic high level, TG1 is in an off state, TG2 is in an on state, TG3 is in an on state, and TG4 is in an off state. In this condition, the output voltage signal VOUT is applied to the input stage 410 through an upper input line UIL, and the input voltage signal VIN is applied to the input stage 410 through a lower input line LIL. Further, when the chopping signal CHOP is at a logic low level, TG1 is in an on state, TG2 is in an off state, TG3 is in an off state, and TG4 is in an on state. In this condition, the input voltage signal VIN is applied to the input stage 410 through the upper input line UIL, and the output voltage signal VOUT is applied to the input stage 410 through the lower input line LIL. Thus, the buffer circuit 400 of FIG. 17 may operate in a chopping mode.

Figure 18:
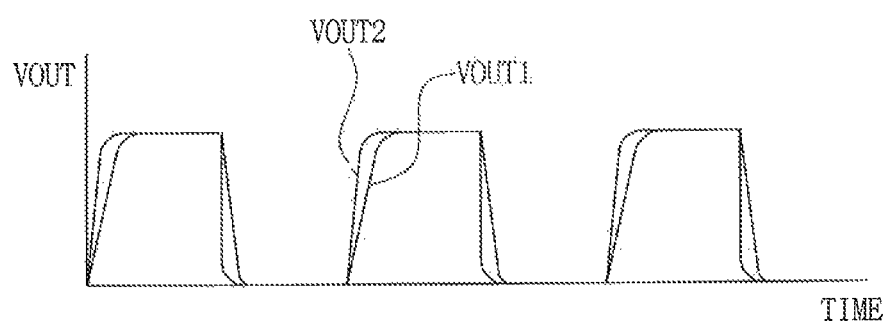
FIG. 18 is a diagram illustrating a waveform of an output signal of a buffer circuit according to an exemplary embodiment of the present inventive concept and a waveform of an output signal of a buffer circuit according to a related art.
Figure 19:
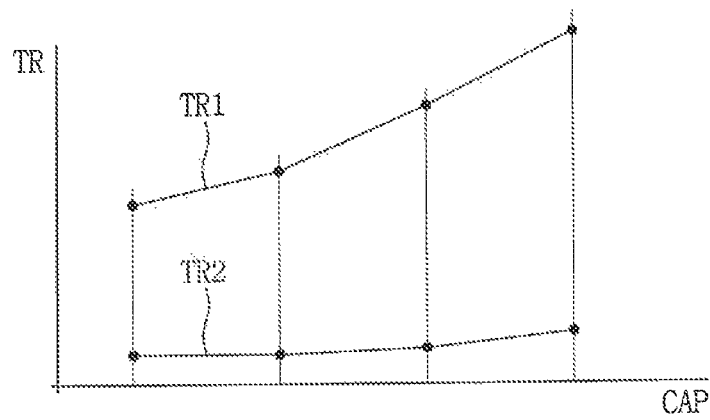
FIG. 19 is a diagram illustrating a rising time of an output signal of a buffer circuit according to an exemplary embodiment of the present inventive concepts and a rising time of an output signal of a buffer circuit according to a related art.

FIG. 18 is a diagram illustrating a waveform of an output signal of a buffer circuit according to an exemplary embodiment of the present inventive concept, compared with a buffer circuit according to a related art, and FIG. 19 is a diagram illustrating a rising time of an output signal of a buffer circuit according to an exemplary embodiment of the present inventive concept, compared with a buffer circuit according to a related art. In FIG. 19, a horizontal axis represents capacitance of a load capacitor connected to an output terminal of a buffer circuit, and a vertical axis represents a rising time of an output voltage signal.

Referring to FIG. 18, when the slew-rate compensation is performed using the buffer circuit according to embodiments of the inventive concepts, an output voltage signal VOUT2 of the buffer circuit according to an exemplary embodiment of the present inventive concept may have a shorter transition time than an output voltage signal VOUT1 of the buffer circuit according to a related art in which the slew-rate compensation might not be performed. For example, when the slew-rate compensation is performed using the buffer circuit according to the exemplary embodiment of the present inventive concept, a slew-rate of the output voltage signal VOUT2 may be enhanced, compared with the output voltage signal VOUT1 generated according to the related art.

Referring to FIG. 19, when the slew-rate compensation is performed using the buffer circuit according to an exemplary embodiment of the present inventive concept, an output voltage signal VOUT2 of the buffer circuit according to an exemplary embodiment of the present inventive concept may have a shorter rising time TR2 than a rising time TR1 of an output voltage signal VOUT1 of a buffer circuit according to a related art in which the slew-rate compensation might not be performed. For example, when the slew-rate compensation is performed using the buffer circuit according to the exemplary embodiment of the present inventive concept, a slew-rate of the output voltage signal VOUT2 may be enhanced, compared with the output voltage signal VOUT1 generated according to the related art.

Thus, the buffer circuit may have a high slew-rate, high output driving capability and low power consumption.

Figure 20:
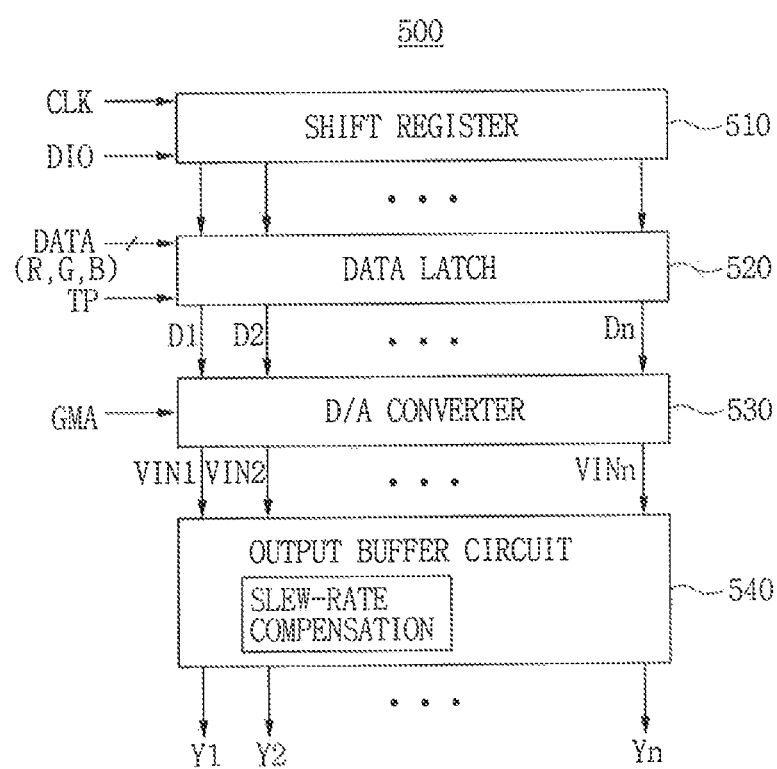
FIG. 20 is a block diagram illustrating a source driving circuit including an output buffer circuit according to an exemplary embodiment of the present inventive concept.

FIG. 20 is a block diagram illustrating a source driving circuit 500 including a buffer circuit according to an exemplary embodiment of the present inventive concept.

Referring to FIG. 20, the source driving circuit 500 may include a shift register 510, a data latch circuit 520, a digital-to-analog converter 530, and an output buffer circuit 540.

The shift register 510 may generate a pulse signal based on a clock signal CLK and an input/output control signal DIO. The data latch circuit 520 may receive data DATA and a load signal TP. The data latch circuit 520 may latch the data DATA according to a shift sequence of the shift register 510 and may output the data DATA when the load signal TP is applied.

The digital-to-analog converter 530 may generate input voltage signals VIN1 to VINn, which are analog signals, corresponding to output signals D1 to Dn of the data latch circuit 520 using a gray voltage GMA. The output buffer circuit 540 may compensate a slew rate and may buffer the input voltage signals VIN1 to VINn to generate source signals Y1 to Yn. The source signals Y1 to Yn may be output to each source line according to a sequence of the data DATA applied to the data latch circuit 520.

The output buffer circuit 540 in the source driving circuit 500 shown in FIG. 20 may have a plurality of buffer circuits. Each of the buffer circuits has substantially the same structure as one of the buffer circuits in FIGS. 1, 9, 13, and 17 according to exemplary embodiments of the present inventive concept. Thus, each buffer circuit may include an operational amplifier and a slew-rate compensating circuit. The operational amplifier may have substantially the same structure as one of the amplifiers in FIGS. 1, 9, 13, and 17. The slew-rate compensating circuit may have substantially the same structure as one of the slew-rate compensating circuits in FIGS. 1, 9, 13, and 17. The slew-rate compensating circuit may be configured to generate a compensation current based on a voltage difference between the input voltage signal and the output voltage signal, to provide a compensation current to a load stage of the operational amplifier, and to reduce a transition time of the output voltage signal of the operational amplifier. Thus, each output voltage signal of the output buffer circuit 540 may have a short transition time and a high slew-rate.

Figure 21:
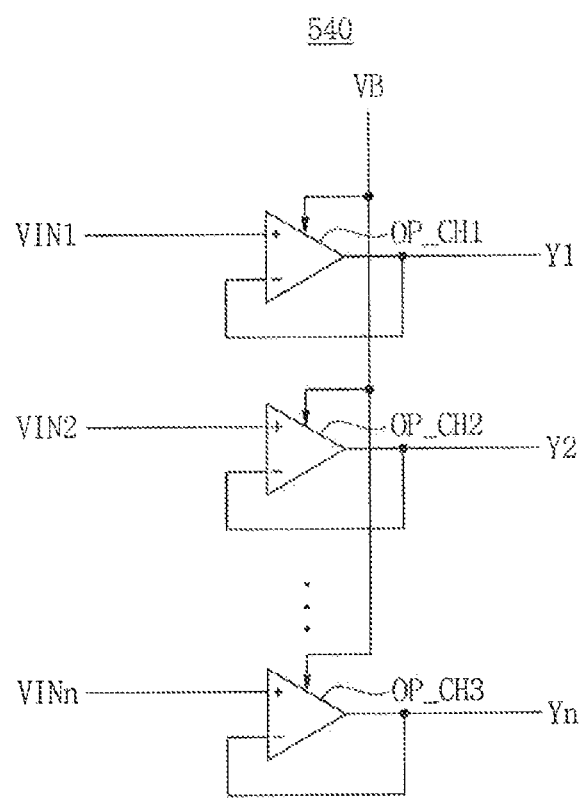
FIG. 21 is a circuit diagram illustrating an example of an output buffer circuit included in the source driving circuit of FIG. 20.

FIG. 21 is a circuit diagram illustrating an example of the output buffer circuit 540 included in the source driving circuit 500 of FIG. 20.

Referring to FIG. 21, the output buffer circuit 540 may include a plurality of channel amplifiers OP_CH1 to OP_CHn and may perform buffering on the input voltage signals VIN1 to VINn to generate the output voltage signals Y1 to Yn. A bias voltage VB may be applied to the channel amplifiers OP_CH1 to OP_CHn.

Figure 22:
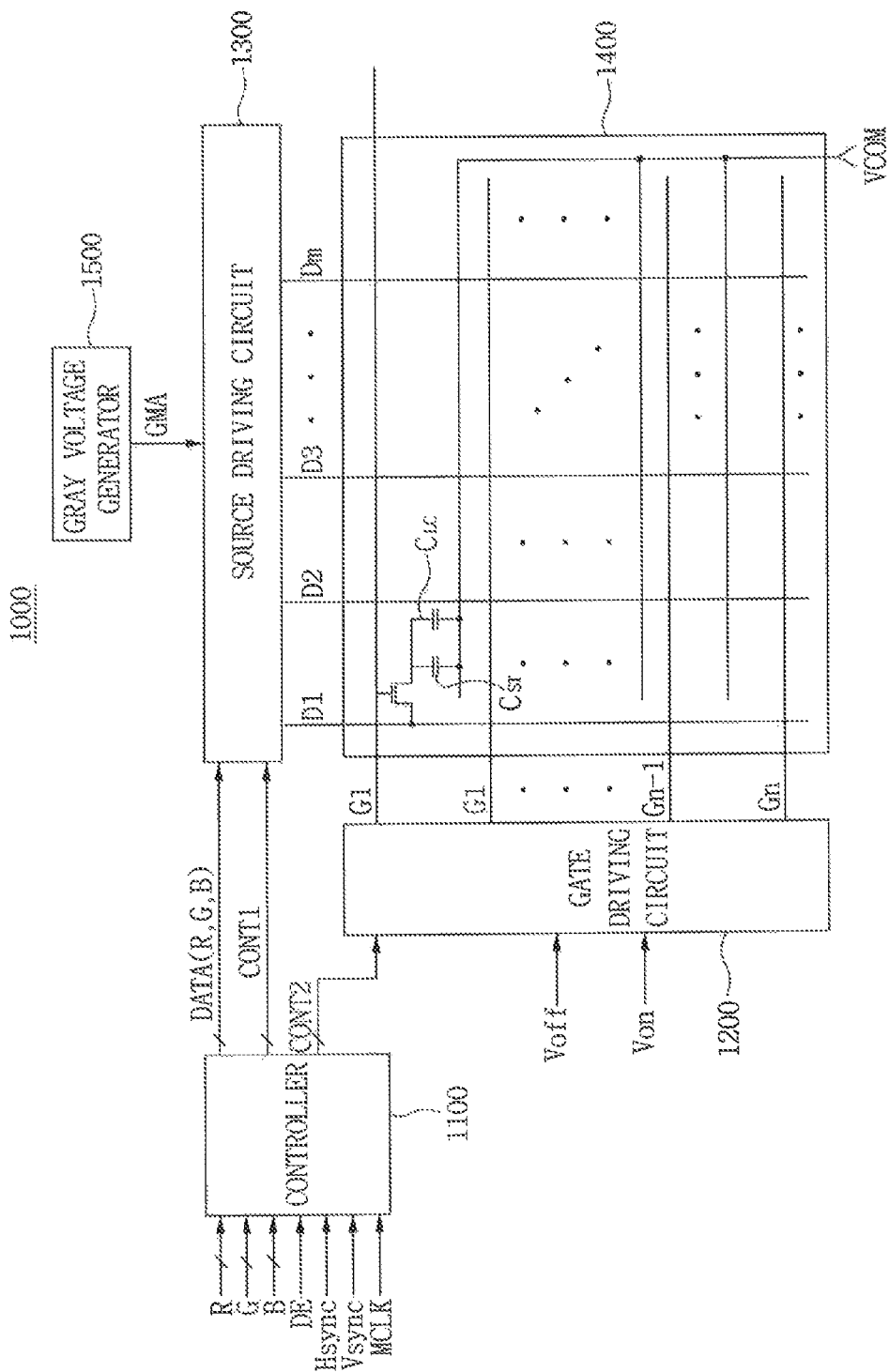
FIG. 22 is a circuit diagram illustrating a liquid crystal display (LCD) device including the source driving circuit of FIG. 20, according to an exemplary embodiment of the present inventive concept.

FIG. 22 is a circuit diagram illustrating an LCD device including the source driving circuit 500 of FIG. 20.

Referring to FIG. 22, the LCD device 1000 may include a controller 1100, a gate driving circuit 1200, a source driving circuit 1300, a liquid crystal panel 1400, and a gray voltage generator 1500.

The liquid crystal panel 1400 may include a plurality of pixels arranged in a matrix form. Each pixel may include thin film transistors (TFTs). The TFT may have a source that receives a source signal (also called a "data signal") and a gate that receives a gate signal (also called a "scan signal"). A storage capacitor CST and a liquid crystal capacitor CLC may be connected between a drain of the TFT and a common voltage VCOM. The liquid crystal panel 1400 may receive the gate signals through gate lines G1 to Gn and the source signals through source lines D1 to Dm. The gate driving circuit 1200 may produce the gate signals by combining an on-voltage Von and an off-voltage Voff, and may apply the gate signals to the gate lines G1 to Gm.

The gray voltage generator 1500 may generate positive and negative gray scale voltages GMA associated with a brightness of the LCD device 1000.

The source driving circuit 1300 may perform a digital-to-analog (D/A) conversion on data DATA received from the controller 1100 by using the gray scale voltages GMA output from the gray voltage generator 1500, and may apply the converted data to the source lines D1 to Dm.

The controller 1100 may receive RGB video signals R, G and B and control signals, such as a vertical sync signal Vsync, a horizontal sync signal Hsync, a main clock signal MCLK, a data enable signal DE, or the like. The controller 1100 may generate source control signals CONT1 and gate control signals CONT2 based on the control signals, and may properly process the RGB video signals R, G and B to meet operation conditions of the liquid crystal panel 1400. Thus, the controller 1100 may transmit the gate control signals CONT2 to the gate driving circuit 1200, and may transmit the source control signals CONT1 and the video signals DATA (R, G, B) to the source driving circuit 1300.

The gate driving circuit 1200 may include a plurality of gate drive integrated circuits (ICs) (not shown) and the source driving circuit 1300 may include a plurality of source drive ICs (not shown). The data DATA may determine a gray level with respect to each pixel. The source driving circuit 1300 may apply the source signals to the source lines D1 to Dm arranged on the liquid crystal panel 1400, and the gate driving circuit 1200 may apply the gate signals to the gate lines arranged on the liquid crystal panel 1400.

The source driving circuit 1300 included in the LCD device 1000 of FIG. 22 may have substantially the same structure as the source driving circuit 500 of FIG. 20. Thus, the LCD device 1000 may include the output buffer circuit 540 of FIG. 20 according to an exemplary embodiment of the present inventive concept. The output buffer circuit included in the LCD device 1000 may include an operational amplifier and a slew-rate compensating circuit. The operational amplifier may be configured to amplify an input voltage signal to generate an output voltage signal. The slew-rate compensating circuit may be configured to generate a compensation current based on a voltage difference between the input voltage signal and the output voltage signal, to provide the compensation current to a load stage of the operational amplifier, and to reduce a transition time of the output voltage signal. Thus, an output voltage signal of the output buffer circuit may have a short transition time and a high slew-rate.

Figure 23:
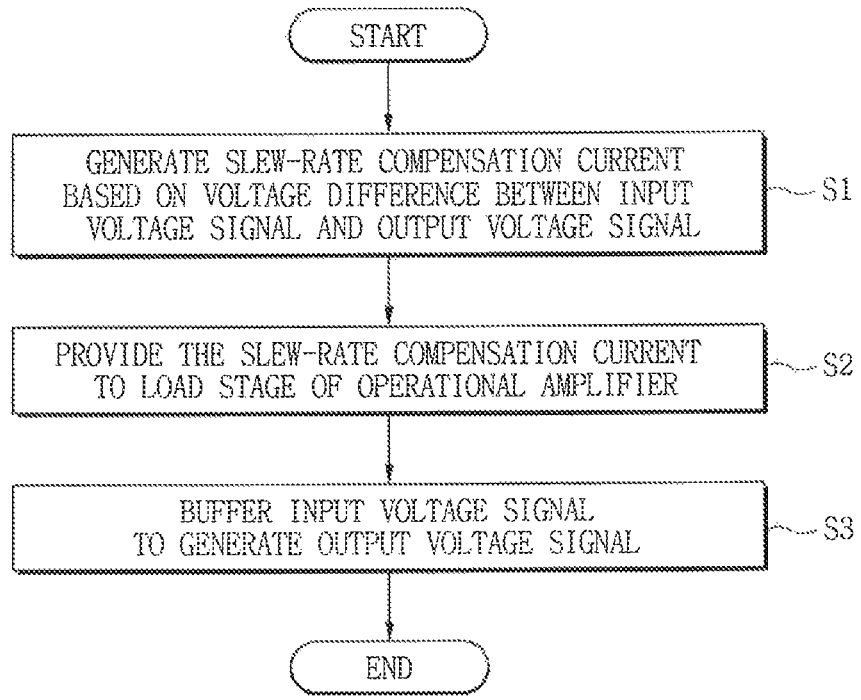
FIG. 23 is a flowchart illustrating a method of controlling a buffer circuit according to an exemplary embodiment of the present inventive concept.

FIG. 23 is a flowchart illustrating a method of controlling a buffer circuit according to an exemplary embodiment of the present inventive concept.

Referring to FIG. 23, the method of controlling a buffer circuit may include:

(1) generating a slew-rate compensation current based on a voltage difference between an input voltage signal and an output voltage signal (S1);

(2) providing the slew-rate compensation current to a load stage of an operational amplifier (S2); and (3) buffering the input voltage signal to generate the output voltage signal (S3).

The providing of the slew-rate compensation current to the load stage of the operational amplifier may include providing the compensation current to the load stage of the operational amplifier when a voltage difference between the input voltage signal and the output voltage signal is greater than a predetermined voltage. The providing of the slew-rate compensation current to the load stage of the operational amplifier may include providing the compensation current to the load stage of the operational amplifier when a voltage difference between the input voltage signal and the output voltage signal is greater than a threshold voltage of a MOS transistor.

Figure 24:
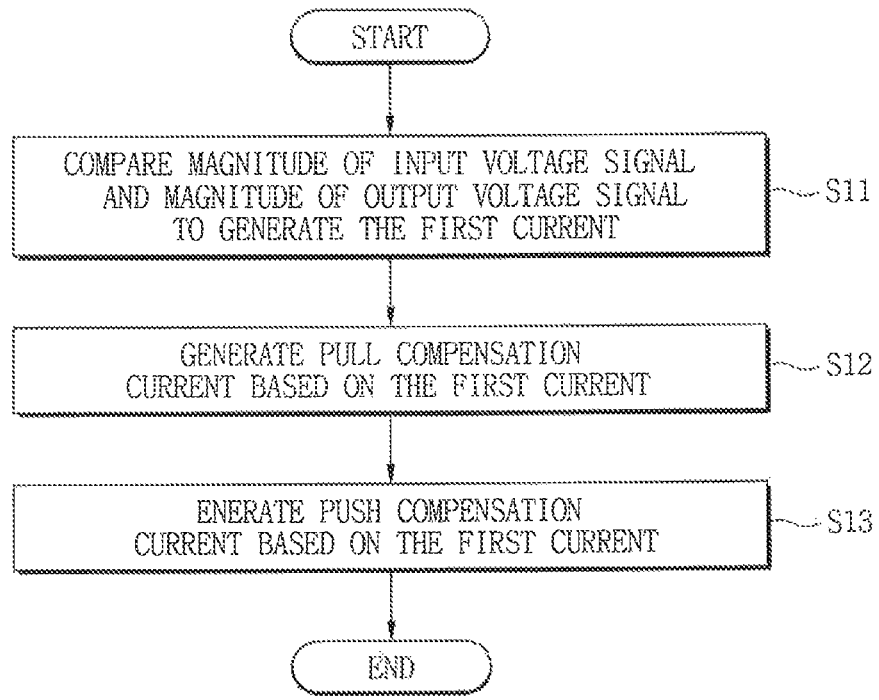
FIG. 24 is a flowchart illustrating a method of generating a slew-rate compensation current included in the method of controlling the buffer circuit FIG. 23, according to an exemplary embodiment of the present inventive concept.

FIG. 24 is a flowchart illustrating a method of generating a slew-rate compensation current included in the method of controlling the buffer circuit.

Referring to FIG. 24, the method of generating a slew-rate compensation current may include:

(1) comparing a magnitude of the input voltage signal and a magnitude of the output voltage signal to generate a first current (S11);

(2) generating a pull compensation current based on the first current (S12); and (3) generating a push compensation current based on the first current (S13).

Although an output buffer circuit, a source driving circuit including the output buffer circuit, and an LCD device having the source driving circuit have been described, the present inventive concept may be applied to general display devices such as a plasma display panel (PDP), an organic light emitting diode (OLED), or the like, in addition to the LCD device.

Embodiments of the present inventive concept may be applied to a buffer circuit, a semiconductor apparatus, and a display device including the buffer circuit.

Although the present inventive concept has been described with reference to exemplary embodiments thereof, it will be understood by those skilled in the art that many modifications in form and details may be made therein without departing from the spirit and scope of the present inventive concept and should not be construed as being limited to the specific embodiments disclosed herein.

What is claimed is:

1. A buffer circuit, comprising:
   an operational amplifier configured to amplify an input voltage signal and to generate an output voltage signal; and
   a slew-rate compensating circuit configured to generate a compensation current based on a voltage difference between the input voltage signal and the output voltage signal, and to provide the compensation current to a load stage of the operational amplifier,
   wherein the slew-rate compensating circuit is configured to generate a push compensation current that flows into the operational amplifier and a pull compensation current that flows out of the operational amplifier, wherein the slew-rate compensating circuit comprises:
   a comparator configured to compare the input voltage signal with the output voltage signal and to generate a first current corresponding to the voltage difference;
   a pull compensation current generator configured to perform a current-mirror operation on the first current and to generate the pull compensation current; and
   a push compensation current generator configured to perform the current-mirror operation on the first current and to generate the push compensation current.

2. The buffer circuit of claim 1, wherein the comparator comprises:
   an NMOS transistor having a gate to which the input voltage signal is applied, a source to which the output voltage signal is applied, and a drain connected to a first node; and
   a PMOS transistor having a gate to which the input voltage signal is applied, a source to which the output voltage signal is applied, and a drain connected to a second node.

3. The buffer circuit of claim 2, wherein the NMOS transistor is turned on and the PMOS transistor is turned off, and the pull compensation current generator is activated, and the slew-rate compensating circuit provides the pull compensation current to the load stage when the input voltage signal is greater than the output voltage signal by a threshold voltage in the NMOS transistor.

4. The buffer circuit of claim 2, wherein the PMOS transistor is turned on and the NMOS transistor is turned off, and the push compensation current generator is activated, and the slew-rate compensating circuit provides the push compensation current to the load stage when the output voltage signal is greater than the input voltage signal by a threshold voltage in the PMOS transistor.

5. The buffer circuit of claim 2, wherein a body of the NMOS transistor is electrically connected to a source of the NMOS transistor, and a body of the PMOS transistor is electrically connected to a source of the PMOS transistor.

6. The buffer circuit of claim 2, wherein the pull compensation current generator comprises:
   a first current source configured to generate a first supply current whose magnitude is adjusted in response to a first control signal;
   a first PMOS transistor having a source connected to a supply voltage, and a drain and a gate commonly connected to the first current source;
   a second PMOS transistor having a source connected to the supply voltage, and a gate connected to the gate of the first PMOS transistor;

a third PMOS transistor having a source connected to a drain of the second PMOS transistor, and a drain and a gate commonly connected to the first node;

a fourth PMOS transistor having a source connected to the supply voltage, and a gate connected to the gate of the third PMOS transistor;

a first NMOS transistor having a drain and a gate commonly connected to a drain of the fourth PMOS transistor, and a source connected to a ground; and a second NMOS transistor having a gate connected to the gate of the first NMOS transistor, a source connected to the ground, and a drain from which the pull compensation current is output.

7. The buffer circuit of claim 2, wherein the push compensation current generator comprises:

a second current source configured to generate a second supply current whose magnitude is adjusted in response to a second control signal;

a first NMOS transistor having a source connected to a ground, and a drain and a gate commonly connected to the second current source;

a second NMOS transistor having a source connected to the ground, and a gate connected to the gate of the first NMOS transistor;

a third NMOS transistor having a source connected to a drain of the second NMOS transistor, and a drain and a gate commonly connected to the second node;

a fourth NMOS transistor having a source connected to the ground, and a gate connected to the gate of the third NMOS transistor;

a first PMOS transistor having a drain and a gate commonly connected to a drain of the fourth NMOS transistor, and a source connected to a supply voltage; and a second PMOS transistor having a gate connected to the gate of the first PMOS transistor, a source connected to the supply voltage, and a drain from which the push compensation current is output.

8. The buffer circuit of claim 2, wherein the pull compensation current generator comprises:

a first PMOS transistor having a source connected to a supply voltage, and a gate connected to an output terminal of a first current mirror circuit included in the load stage of the operational amplifier;

a second PMOS transistor having a source connected to a drain of the first PMOS transistor, a drain and a gate commonly connected to the first node;

a third PMOS transistor having a source connected to the supply voltage, and a gate connected to a gate of the second PMOS transistor;

a first NMOS transistor having a drain and a gate commonly connected to a drain of the third PMOS transistor, and a source connected to a ground; and a second NMOS transistor having a gate connected to the gate of the first NMOS transistor, a source connected to the ground, and a drain from which the pull compensation current is output.

9. The buffer circuit of claim 2, wherein the push compensation current generator comprises:

a first NMOS transistor having a source connected to a ground, and a gate connected to an output terminal of a second current mirror circuit included in the load stage of the operational amplifier;

a second NMOS transistor having a source connected to a drain of the first NMOS transistor, and a drain and a gate commonly connected to the second node;

a third NMOS transistor having a source connected to the ground, and a gate connected to the gate of the second NMOS transistor;

a first PMOS transistor having a drain and a gate commonly connected to a drain of the third NMOS transistor, and a source connected to a supply voltage; and a second PMOS transistor having a gate connected to the gate of the first PMOS transistor, a source connected to the supply voltage, and a drain from which the push compensation current is output.

* * * * *